(12) United States Patent
Kang et al.

(10) Patent No.: US 12,044,733 B2
(45) Date of Patent: Jul. 23, 2024

(54) FLIP-FLOPS AND SCAN CHAIN CIRCUITS INCLUDING THE SAME

(71) Applicant: Samsung Electronics Co., Ltd., Suwon-si (KR)

(72) Inventors: Byounggon Kang, Suwon-si (KR); Dalhee Lee, Suwon-si (KR); Giyoung Yang, Suwon-si (KR); Minji Kim, Suwon-si (KR); Taejung Seol, Suwon-si (KR); Jaebeom Yang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/194,643

(22) Filed: Apr. 2, 2023

(65) Prior Publication Data
US 2024/0061039 A1    Feb. 22, 2024

(30) Foreign Application Priority Data
Aug. 17, 2022 (KR) .......................... 10-2022-0102505

(51) Int. Cl.
  *G01R 31/3185* (2006.01)
  *G01R 31/317* (2006.01)
(52) U.S. Cl.
  CPC ........... *G01R 31/318525* (2013.01); *G01R 31/31725* (2013.01); *G01R 31/318541* (2013.01)

(58) Field of Classification Search
  CPC ...... G01R 31/318525; G01R 31/31725; G01R 31/318541
  See application file for complete search history.

(56) References Cited

U.S. PATENT DOCUMENTS

| | | | |
|---|---|---|---|
| 7,596,732 B2 | 9/2009 | Branch et al. |
| 8,020,131 B1 | 9/2011 | Van et al. |
| 9,366,727 B2 | 6/2016 | Gurumurthy |
| 9,853,630 B2 | 12/2017 | Kao et al. |
| 10,410,699 B1 | 9/2019 | Thaploo et al. |
| 10,473,718 B2 | 11/2019 | Agarwal et al. |
| 10,659,017 B1 | 5/2020 | Rengarajan et al. |

FOREIGN PATENT DOCUMENTS

JP          2008070375 A       3/2008

*Primary Examiner* — April Y Blair
*Assistant Examiner* — Rong Tang
(74) *Attorney, Agent, or Firm* — Myers Bigel, P.A.

(57) ABSTRACT

A flip-flop circuit may include a selection circuit, a master latch circuit and a slave latch circuit. The selection circuit includes a multiplexer and first and second inverters. The multiplexer outputs a data signal or a scan input signal to a first node in response to an enable signal. The first inverter is connected to the first node and provides an inversion of a signal of the first node to a second node in response to a clock signal. The second inverter is connected to the second node and provides an inversion of the signal of the second node to a third node in response to the clock signal and a signal of a fourth node. The master latch circuit is connected between the third and fourth nodes. The slave latch circuit is connected between the fourth node and an output terminal of the flip-flop circuit.

20 Claims, 19 Drawing Sheets

FLIP-FLOPS AND SCAN CHAIN CIRCUITS INCLUDING THE SAME

CROSS TO REFERENCE TO RELATED APPLICATION(S)

This application claims benefit of priority to Korean Patent Application No. 10-2022-0102505 filed on Aug. 17, 2022, in the Korean Intellectual Property Office, the disclosure of which is hereby incorporated herein by reference in its entirety.

BACKGROUND

The present disclosure relates to flip flops and scan chain circuits including the same.

Recently, with mobile convergence, interest in power-saving techniques for mobile devices (e.g., smartphones, or the like) has increased. Generally, since a mobile device uses limited power from an element such as a battery, to reduce power of the mobile device, it may be useful/necessary to design the mobile device using a low-power chip including a low-power flip-flop for efficient power management. To design a low-power chip, a multi-bit flip-flop has been suggested in which a plurality of flip-flops may share a clock signal.

Meanwhile, multi-bit flip-flops may be collectively scanned and tested while the plurality of flip-flops are connected in a chain form and a scan input signal is transmitted through the plurality of flip-flops connected to each other. If one of flip-flops latches an incorrect signal during the scan test, the incorrect signal may be transferred to the connected flip-flops, and the scan test may result in an error.

SUMMARY

According to some example embodiments of the present disclosure, reliability of a scan test may be improved by reducing/preventing loss of a scan input signal received from a previous flip-flop in a scan chain circuit including a plurality of flip-flops.

According to some example embodiments of the present disclosure, a flip-flop circuit may include a selection circuit, a master latch circuit, and a slave latch circuit. The selection circuit has first and second nodes, and the selection circuit includes: first, second, and third P-type transistors connected in series between a power supply terminal and the first node; fourth and fifth P-type transistors connected in series between the power supply terminal and the first node; first and second N-type transistors connected in series between the first node and a power ground terminal; third and fourth N-type transistors connected in series between the first node and the power ground terminal; and a first inverter. The first inverter has a first inverter input terminal connected to the first node and a first inverter output terminal connected to the second node, wherein the first inverter is configured to output one of a data signal or a scan input signal to the first inverter output terminal in response to a clock signal and/or a signal of a third node. A scan enable signal is input to gates of the first N-type transistor and the fifth P-type transistor, and the data signal is input to gates of the fourth P-type transistor and the fourth N-type transistor. An inverted scan enable signal is input to gates of the third P-type transistor and the third N-type transistor, and the scan input signal is input to gates of the second P-type transistor and the second N-type transistor. The master latch circuit is connected between the second node and the third node, and a slave latch circuit is connected between the third node and a flip-flop circuit output terminal.

According to some example embodiments of the present disclosure, a flip-flop circuit may include a selection circuit, a master latch circuit, and a slave latch circuit. The selection circuit include a multiplexer, a first inverter, and a second inverter, wherein the first inverter is connected between the multiplexer and the second inverter. The multiplexer is configured to output one of a data signal or a scan input signal to a first node in response to a scan enable signal. The first inverter is connected between the first node and a second node, wherein the first inverter is configured to invert a signal of the first node to provide a first inverted signal to the second node in response to a clock signal. The second inverter is connected between the second node and a third node, wherein the second inverter is configured to invert the first inverted signal of the second node to provide a second inverted signal the third node in response to a clock signal and a signal of a fourth node. The master latch circuit is connected between the third node and the fourth node, and the slave latch circuit is connected between the fourth node and a flip-flop circuit output terminal of the flip-flop circuit so that the master latch circuit is connected between the selection circuit and the slave latch circuit.

According to some example embodiments of the present disclosure, a scan chain circuit may include first and second flip-flops. The first flip-flop includes a first selection circuit, a first master latch circuit, and a first slave latch circuit, wherein the first selection circuit includes a first selection circuit input terminal configured to receive a first scan input signal, and wherein the first slave latch circuit includes a first slave latch circuit output terminal. The second flip-flop includes a second selection circuit, a second master latch circuit, and a second slave circuit. The second selection circuit includes a second selection circuit input terminal connected to the first slave latch circuit output terminal. The second master latch circuit includes a second master latch circuit input terminal, the first and second flip-flops share a clock signal, the second flip-flop inverts the clock signal to generate a second clock buffer signal, and the second selection circuit includes first, second, and third inverters. The first inverter is configured to invert a second scan input signal received at the second selection circuit input terminal from the first slave latch circuit output terminal to generate an inverted scan input signal that is output to a first node when the clock signal is at a logic low state and a scan enable signal is at a logic high state. The second inverter is configured to invert a data signal received from outside the scan chain circuit to generate an inverted data signal that is output to the first node when the scan enable signal is at a logic low state. The third inverter is configured to invert a signal of the first node based on the clock signal and/or the second clock buffer signal to generate an inverted first node signal and to output the inverted first node signal to the second master latch circuit input terminal.

According to some example embodiments of the present disclosure, a scan chain circuit may include first and second flip-flops. The first flip-flop includes a first selection circuit, a first master latch circuit, and a first slave latch circuit, wherein the first selection circuit includes a first selection circuit input terminal configured to receive a first scan input signal, and wherein the first slave latch circuit includes a first slave latch circuit output terminal. The second flip-flop includes a second selection circuit, a second master latch circuit, and a second slave circuit. The second selection circuit includes a second selection circuit input terminal connected to the first slave latch circuit output terminal, the first and second flip-flops share a clock signal, and the second flip-flop inverts the clock signal to generate a second clock buffer signal. The second selection circuit includes a multiplexer, a first inverter, and a second inverter. The multiplexer is configured to selectively generate a data signal responsive to input from outside the scan chain circuit or responsive to input from the first slave latch circuit output terminal based on a scan enable signal. The first inverter is configured to invert the data signal from the multiplexer to generate an inverted data signal when the clock signal is at a logic low state. The second inverter is configured to invert the inverted data signal from the first inverter to regenerate the data signal that is provided to the second master latch circuit based on the clock signal and/or the clock buffer signal.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
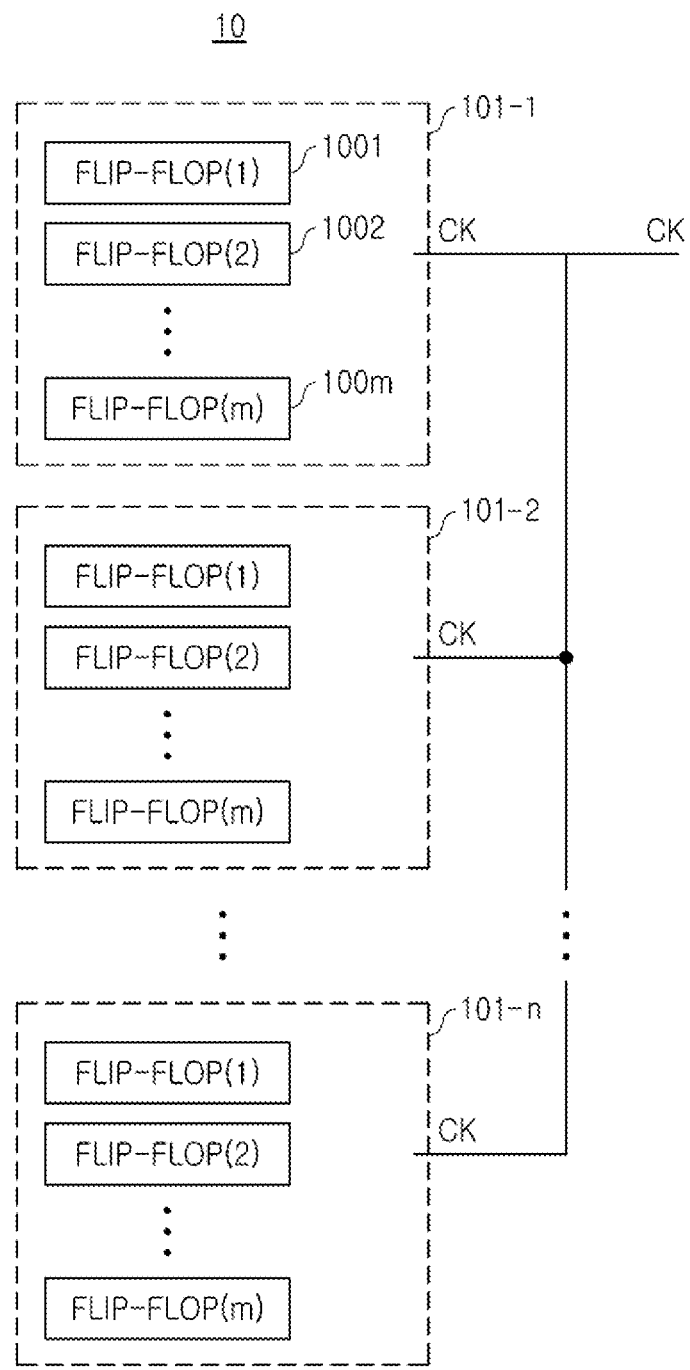
FIG. 1 is a block diagram illustrating a multi-bit flip-flop group according to some example embodiments of the present disclosure.

FIG. 1 is a block diagram illustrating a multi-bit flip-flop group according to some example embodiments of the present disclosure.

Referring to FIG. 1, a multi-bit flip-flop group 10 may include multi-bit flip-flops 101-1 to 101-n sharing a clock signal CK. Each of the multi-bit flip-flops 101-1 to 101-n may include a plurality of flip-flops 1001 to 100m. Each of the plurality of flip-flops 1001-100m may receive the clock signal CK. Each of the plurality of flip-flops 1001-100m may output latched input signals as output signals when the clock signal CK transitions. Since each multi-bit flip-flop 101-1 to 101-n shares the clock signal CK, power consumption may be less than that of single-bit flip-flops used to store the same number of bits.

Each of the multi-bit flip-flops 101-1 to 101-n may receive a single-phase clock signal CK. For each of the plurality of flip-flops 1001 to 100m to operate, a clock buffer signal CKb having a phase inverted from that of the clock signal CK may be useful/required. The plurality of flip-flops 1001-100m of a multi-bit flip-flop 101 may supply the clock buffer signal CKb by connecting a predetermined internal node to a device using/requiring the clock buffer signal CKb, instead of obtaining the clock buffer signal CKb from an external clock buffer. A multi-bit flip-flop 101 may thus operate with reduced/low power by not including clock buffers to generate the clock buffer signal CKb.

Meanwhile, the plurality of flip-flops 1001-100m of a multi-bit flip-flop 101 may be connected to each other in series and may be included in a scan chain circuit such that a scan test for the plurality of flip-flops 1001-100m may be more effectively performed.

Figure 2:
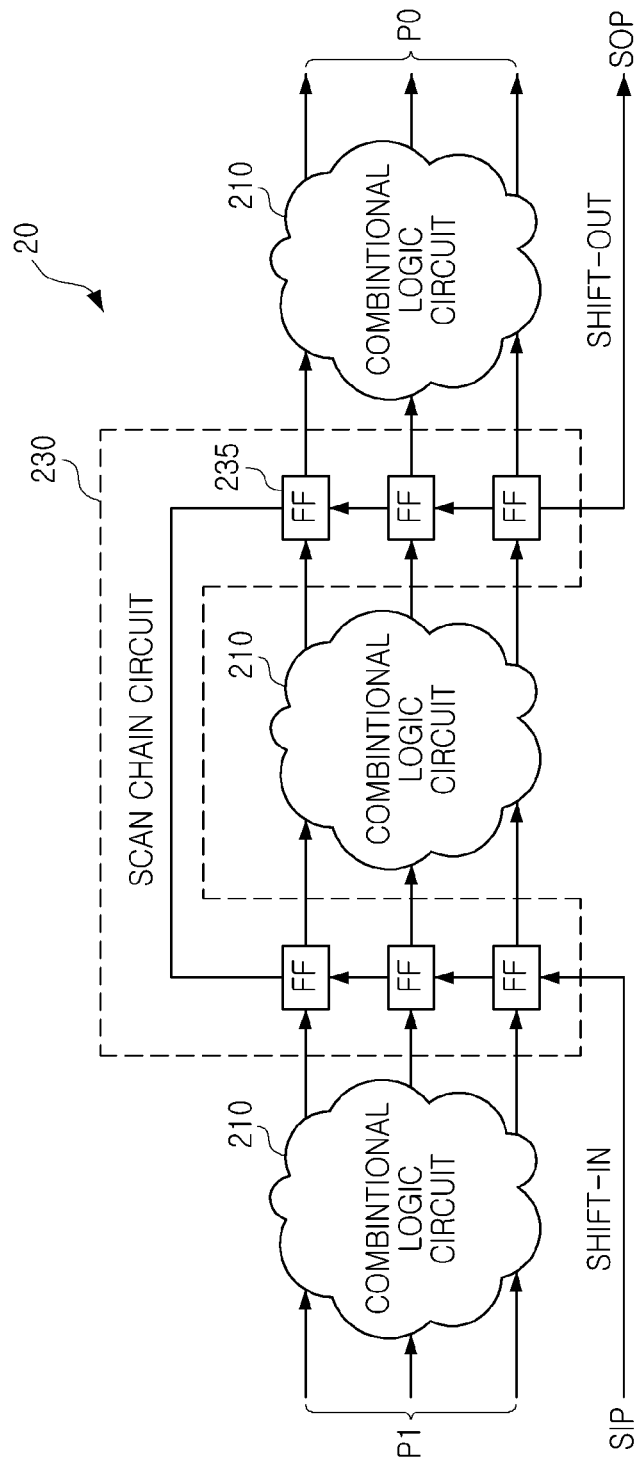
FIG. 2 is a block diagram illustrating an integrated circuit having a scan chain circuit according to some example embodiments of the present disclosure.

FIG. 2 is a block diagram illustrating an integrated circuit having a scan chain circuit according to some example embodiments of the present disclosure.

Referring to FIG. 2, the integrated circuit 20 may include a combinational logic circuit 210 and a scan chain circuit 230. The combinational logic circuit 210 may include flip-flops (FF) 235, and the flip-flops 235 may be connected to the combinational logic circuit 210 and may form a scan path. Meanwhile, in FIG. 2, the entirety of the combinational logic circuits 210 in the integrated circuit 20 may be connected to the scan chain circuit 230, or a portion of combinational logic circuits 210 not using/requiring a scan test may not be connected to the scan chain circuit 230. In some example embodiments of the present disclosure, the integrated circuit 20 may be implemented as a system on-chip (SOC).

The combinatorial logic circuit(s) 210 may include logic cones, multiplexers, and the like. In this case, the combinational logic circuit 210 may be connected to the scan chain circuit 230 for the scan test. Generally, the scan test for the integrated circuit 20 may include: performing a shift-in operation in which the test pattern (Signal Input Part or SIP) is sequentially loaded into the scan chain circuit 230 (that is, indicated as SHIFT-IN); performing a capture operation in which an observation value (Signal Output Part or SOP) of the combinational logic circuit 210 based on the loaded test pattern SIP is stored in the scan chain circuit 230; and performing a shift-out operation in which the result value (SOP) stored in the scan chain circuit 230 is output in sequence (that is, indicated as SHIFT-OUT).

To this end, the scan chain circuit 230 may include multi-bit flip-flops sharing a clock signal, and each of the multi-bit flip-flops may receive flip-flops 235 and a clock signal CK used to operate the flip-flops 235.

Figure 3:
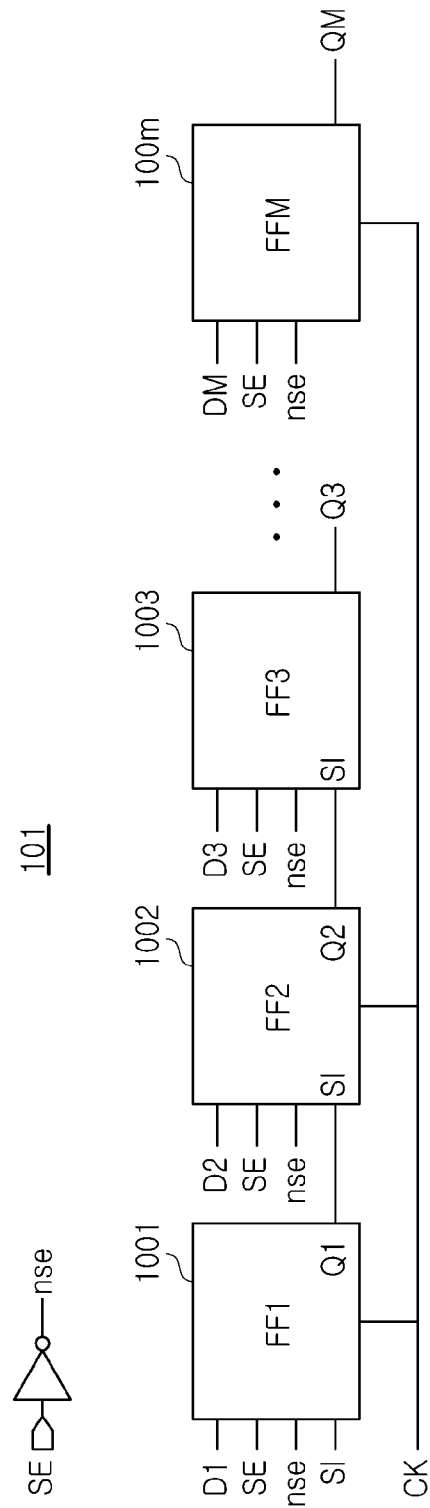
FIG. 3 is a block diagram illustrating a multi-bit flip-flop according to some example embodiments of the present disclosure.

FIG. 3 is a block diagram illustrating a multi-bit flip-flop 101 according to some example embodiments of the present disclosure.

The multi-bit flip-flop 101 in FIG. 3 may correspond to one of the multi-bit flip-flops 101 described with reference to FIG. 1. The plurality of flip-flops 1001-100m included in the multi-bit flip-flop 101 in FIG. 3 may correspond to the flip-flop 235 in FIG. 2.

When the scan enable signal SE has a logic high H state (also referred to as a logic high H level), the plurality of flip-flops 1001-100m may output the scan input signal SI to the output signals Q1, Q2, Q3, . . . , QM. When the scan enable signal SE has a logic low L state (also referred to as a logic low level), the plurality of flip-flops 1001-100m may output the input signals D1, D2, D3, . . . , DM as the output signals Q1, Q2, Q3, . . . , QM. In other words, each of the plurality of flip-flops 1001-100m may selectively operate in a normal operating mode or a scan test mode based on the scan enable signal SE.

Referring back to FIG. 2, while the scan enable signal SE applied to the integrated circuit 20 has a logic high H state, a shift-in operation may be performed whereby a predetermined test pattern SI is applied in sequence to the scan chain circuit through the scan test input terminal SIP of the integrated circuit 20. Thereafter, a capture operation may be performed whereby a result value of the combinational logic circuit 210 based on the test pattern SI loaded into the scan chain circuit 230 may be stored in the scan chain circuit 230. In this case, the scan enable signal SE applied to the integrated circuit 20 may have a logic low L state. When the scan enable signal SE applied to the integrated circuit 20 has a logic high H state again, a shift-out operation may be performed whereby the result values stored in the scan chain circuit 230 are output in sequence through the scan test output terminal SOP of the integrated circuit 20.

Figure 4:
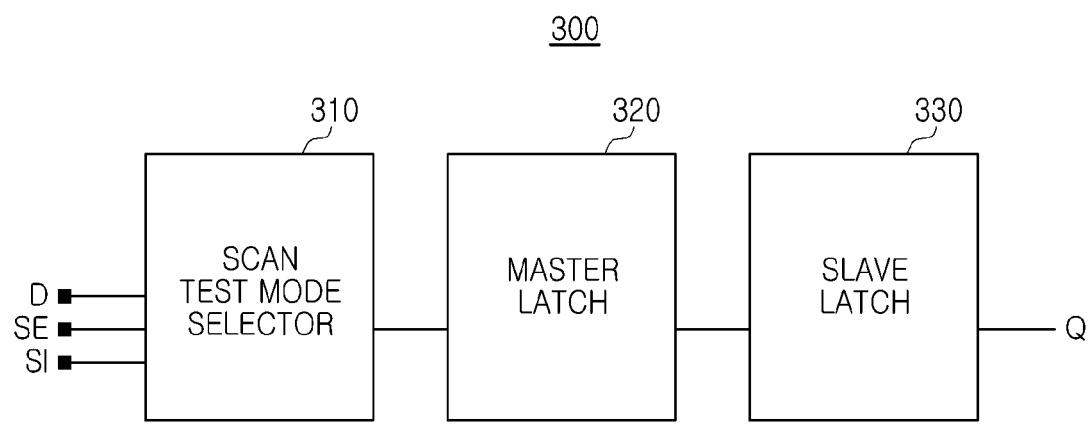
FIG. 4 is a block diagram illustrating a flip-flop included in the multi-bit flip-flop of FIG. 3.

FIG. 4 is a block diagram illustrating a flip-flop included in the multi-bit flip-flop 101 of FIG. 3.

The flip-flop 300 in FIG. 4 may correspond to an individual one of the flip-flops 1001-100m in FIGS. 1 and 3 and/or the flip-flop 235 in FIG. 2. The flip-flop 300 may include a selector 310, a master latch 320, and a slave latch 330.

The selector 310 may determine whether the flip-flop 300 operates in a scan test mode or a normal operating mode based on the scan enable signal SE. Specifically, when the scan enable signal SE has a logic high H state, the selector 310 may output the scan input signal SI to the master latch 320; and when the scan enable signal SE has a logic low L state, the selector 310 may output the data signal D to the master latch 320.

The master latch 320 may latch the signal output by the selector 310 when the clock signal transitions, and the master latch 320 may output the signal to the slave latch 330. The slave latch 330 may latch the signal output by the master latch 320 when the clock signal transitions again, and the slave latch 330 may output the latched signal as the output signal Q. Similar to the flip-flop 300 in FIG. 4, in the master-slave flip-flop including the master latch 320 and the slave latch 330, an input and an output may be separated, such that a race issue may be reduced.

Meanwhile, the selector 310, the master latch 320, and the slave latch 330 may operate in synchronization with the clock signal CK and the clock buffer signal CKb. As described with reference to FIG. 1, the clock buffer signal CKb may be obtained from a predetermined node of the flip-flop 300 operating in response to the clock signal CK. Accordingly, the clock buffer signal CKb may be gradually toggled after the clock signal CK is toggled.

When the hold time (which is the time for which the selector 310 maintains the signal output to the master latch 320) is not sufficient, there may be a risk that the signal may be lost before the clock buffer signal CKb is completely toggled. For example, the output terminal of the selector 310 may be connected to an N-type transistor receiving the clock buffer signal CKb at a gate thereof, and when the clock buffer signal CKb is not turned off in time, a leakage current may occur, and the signal at the output terminal may be lost. When the signal of the selector 310 is lost, the master latch 320 may latch an erroneous signal, and accordingly, the flip-flop 300 may output an erroneous signal.

In the normal operating mode, the elements of the combinational logic circuit may be connected between flip-flops, and since the elements may serve as a buffer for a signal input to the selector 310, the hold time of the signal output by the selector 310 may be sufficiently secured. However, in the scan test mode, since the signal of the output terminal of one flip-flop is directly connected to the input terminal of another flip-flop, the hold time of the selector 310 may be shortened, and there may be an increased/high risk of signal loss.

In some example embodiments of the present disclosure, the signal loss of the selector 311 may be reduced/prevented and the issue in which the master latch 320 latches the wrong signal may be reduced/prevented in the scan test mode. Accordingly, in the scan test mode of the flip-flop 300 included in the scan chain circuit, accuracy of the test result may be improved.

Figure 5:
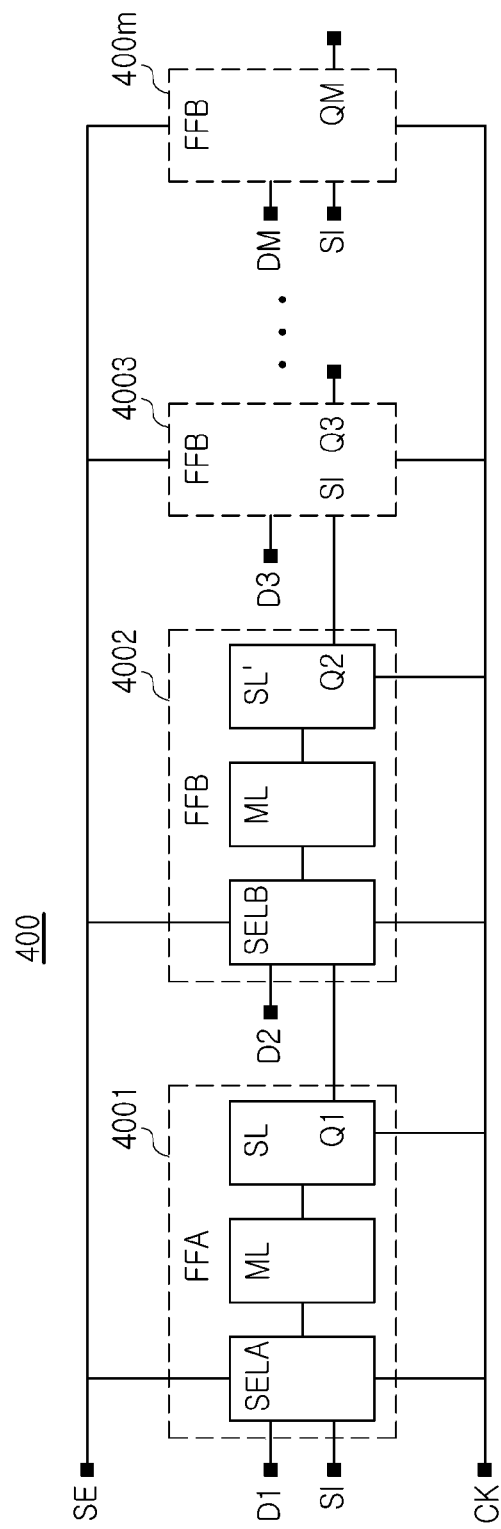
FIG. 5 is a block diagram illustrating a multi-bit flip-flop including first and second flip-flops according to some example embodiments of the present disclosure.

FIG. 5 is a block diagram illustrating a multi-bit flip-flop including first and second flip-flops according to some example embodiments of the present disclosure.

Referring to FIG. 5, the multi-bit flip-flop 400 may include a plurality of flip-flops 4001-400m. The plurality of flip-flops 4001 to 400m may be included in a scan chain circuit. The plurality of flip-flops 4001-400m may include a first flip-flop FFA 4001 and second flip-flops FFB 4002-400m. The first flip-flop FFA may refer to the first flip-flop of the scan chain circuit, that is, a flip-flop receiving the scan input signal SI from an external entity without receiving the scan input signal SI from another flip-flop. Also, each second flip-flop FFB may refer to a flip-flop obtaining an output from another flip-flop of the scan chain circuit, that is, a flip-flop obtaining the scan input signal SI from the output terminal of another flip-flop of the multi-bit flip-flop.

In some example embodiments of the present disclosure, the first flip-flop FFA and the second flip-flops FFB may have different structures. In FIG. 5, the first flip-flop FFA may include a selector SELA, a master latch ML, and a slave latch SL, and each second flip-flop FFB may include a selector SELB, a master latch ML, and a slave latch SL'. In the example in FIG. 5, the first flip-flop FFA and each second flip-flop FFB may include a master latches ML having the same structure and slave latches SL and SL' having similar structures, or may include selectors SELA and SELB having different structures.

In some example embodiments of the present disclosure, the selector SELB may include elements to reduce/prevent loss of the signal from the output terminal. For example, when the selector SELB includes a first inverter circuit connected to the output terminal and operating based on the clock signal CK and the clock buffer signal CKb, the selector SELB may include a second inverter circuit connected to the input terminal of the inverter circuit and operating based on the clock signal CK. The selector SELB may hold a signal input to the first inverter circuit and a signal output to the first inverter circuit using the second inverter circuit to quickly/immediately respond to the clock signal CK even when current leakage occurs in the first inverter circuit because the clock buffer signal CKb is not toggled in time.

Figure 6:
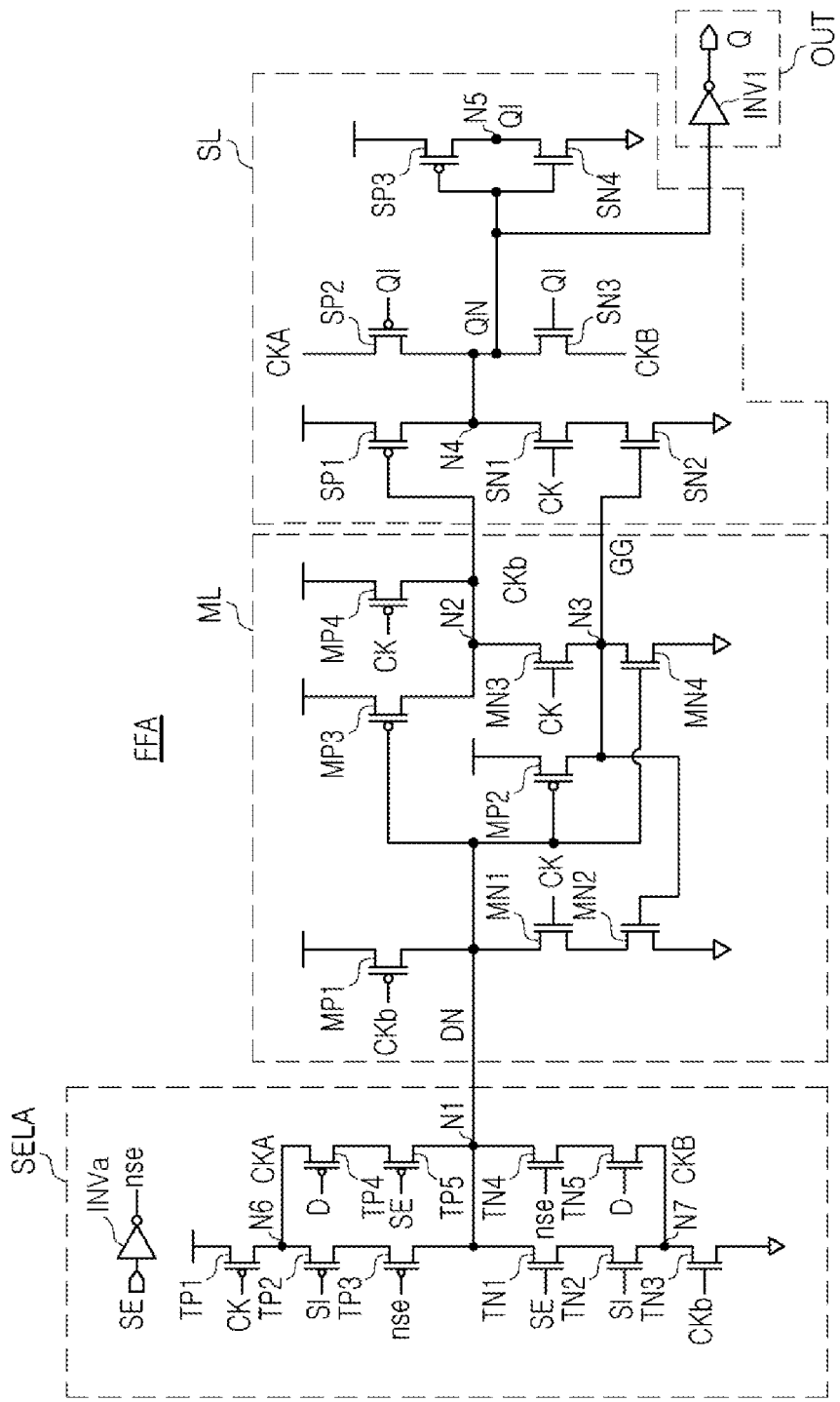
FIG. 6 is a circuit diagram illustrating a first flip-flop according to some example embodiments of the present disclosure.

FIG. 6 is a circuit diagram illustrating a first flip-flop according to some example embodiments of the present disclosure.

Referring to FIG. 6, the first flip-flop FFA may include a selector SELA, a master latch ML, and a slave latch SL. The first flip-flop FFA may further include an output driver OUT.

The selector SELA may include TP1-TP5 transistors which are P-type transistors and TN1-TN5 transistors which are N-type transistors. Also, the selector SELA may further include an inverter circuit INVa configured to receive the scan enable signal SE and to generate an inverted scan enable signal nse.

The TP1 transistor may be connected between the power supply terminal and the N6 node. The TP2-TP3 transistors may be connected in series between the N1 node and the N6 node, TP4-TP5 transistors may be connected in series between the N1 node and the N6 node, and the TP2-TP3 transistors may be connected in parallel with the TP4-TP5 transistors. Also, the TN1-TN2 transistors may be connected in series between the N1 node and the N7 node, the TN4-TN5 transistors may be connected in series between the N1 node and the N7 node, and the TN1-TN2 transistors may be connected in parallel with the TN4-TN5 transistors. The TN3 transistor may be connected between the N7 node and the power ground terminal.

The gates of the TN1 and TP5 transistors may receive the scan enable signal SE, and the gates of the TP3 and TN4 transistors may receive the inverted scan enable signal nse. The TP4 and TN5 transistors may receive the data signal D, and the TP2 and TN2 transistors may receive the scan input signal SI. The gate of the TP1 transistor may receive the clock signal CK, and the gate of the TN3 transistor may receive the clock buffer signal CKb. The clock buffer signal CKb may be obtained from an N2 node, which will be described later.

The master latch MLA may include MP1-MP4 transistors which are P-type transistors, and MN1-MN4 transistors which are N-type transistors. The MP1 transistor may be connected between the power supply terminal and the N1 node. The MN1 and MN2 transistors may be connected to each other in series between the N1 node and the power ground terminal. The MP1 transistor may be gated with the clock buffer signal CKb, and the MN1 transistor may be gated with the clock signal CK.

MP3 and MP4 transistors may be connected to each other in parallel between the power supply terminal and the N2 node. The MP2 transistor may be connected between the power supply terminal and the N3 node, and the MN3 transistor may be connected between the N2 node and the M3 node. The MN4 transistor may be connected to the N3 node and the power ground terminal. The gates of the MP2, MP3 and MN4 transistors may be connected to the N1 node. The MP4 and MN3 transistors may be gated with the clock signal CK.

The slave latch SLA may include SP1-SP3 transistors which are P-type transistors, and SN1-SN4 transistors which are N-type transistors. The SP1 transistor may be connected between the power supply terminal and the N4 node, and the SN1 and SN2 transistors may be connected in series between the N4 node and the power ground terminal. The gate of the SP1 transistor may be connected to the N2 node, the gate of the SN2 transistor may be connected to the N3 node, and the SN1 transistor may be gated by the clock signal CK.

The SP2 transistor may be connected between the N6 node (carrying the CKA signal) and the N4 node, and the SN3 transistor may be connected between the N4 node and the N7 node (carrying the CKB signal). The SP3 transistor may be connected between the power supply node and the N5 node, and the SN4 transistor may be connected between the power ground node and the N5 node. The SP2, SN3, SP3 and SN4 transistors may function as latches configured to latch the signal of the N4 node.

The output driver OUT may include an inverter INV1 configured to invert the signal of the N4 node and to output the signal as the output signal Q.

Hereinafter, an operation of the first flip-flop FFA will be described. When the clock signal CK has a logic low L state, the selector SELA may invert one of the data signal D or the scan input signal SI according to the state of the scan enable signal SE, and may output the inverted signal to the N1 node.

Specifically, in the selector SELA, when the scan enable signal SE is at a logic low L state, the TN1 transistor may be turned off and the TP5 transistor may be turned on. Also, the TP3 transistor may be turned off and the TN4 transistor may be turned on by the inverted scan enable signal nse. When the clock signal CK is at a logic low L state, the TP1 transistor of the selector may be turned on. Also, the MP4 transistor of the latch unit LA may be turned on and the MN3 transistor may be turned off, such that the N2 node may be at a logic high H state. The gate of the TN3 transistor may receive the N2 signal as the clock buffer signal CKb, and the TN3 transistor may be turned on. The selector SELA may output a signal obtained by inverting the data signal D to the N1 node.

When the scan enable signal SE is at a logic high H state, the TN1 and TP3 transistors may be turned on, and the TP5 and TN4 transistors may be turned off. When the clock signal CK is at a logic low L state, the TP1 transistor may be turned on and the TN3 transistor may be turned on. The selector SELA may output a signal obtained by inverting the scan input signal SI to the N1 node.

When the clock signal CK is at a logic high H state, the latch unit LA may latch the signal of the N1 node and may output the signal of the N1 node to the N4 node. Specifically, when the clock signal CK is toggled from a logic low L state to a logic high H state, the MN1 and MN3 transistors gated to the clock signal CK may be turned on, and the MP4 transistor may be turned off. The signal of the N1 node may be input to the gates of the MP3, MP2, and MN4 transistors. When the signal of the N1 node is at a logic high H state, the MP2 and MP3 transistors may be turned off, and the MN4 transistor may be turned on. Accordingly, the clock buffer signal CKb of the N2 node may have a logic low L state, and the GG signal of the N3 node may also have a logic low L state. The clock buffer signal CKb may be fed back to the gate of the MP1 transistor and may turn on the MP1 transistor, and the GG signal may be fed back to the gate of the MN2 transistor and may turn off the MN2 transistor. Accordingly, the signal of the N1 node may be maintained at a logic high H state. Meanwhile, the SP1 transistor may be turned on by receiving the clock buffer signal CKb through a gate, and the SN2 transistor may be turned off by receiving the GG signal through a gate. Accordingly, a logic high H state/signal, that is, a signal having the same state as that of the N1 node may be transmitted to the N4 node.

When the signal of the N1 node is at a logic low L state, the MP2 and MP3 transistors may be turned on, and the MN4 transistor may be turned off. Accordingly, the clock buffer signal CKb may be maintained at a logic high H state, and the GG signal may also be at a logic high H state. The clock buffer signal CKb may be fed back to the gate of the MP1 transistor and may turn off the MP1 transistor, and the GG signal may be fed back to the gate of the MN2 transistor and may turn on the MN2 transistor. Accordingly, the signal of the N1 node may be maintained at a logic low L state. Meanwhile, the SP1 transistor may be turned off by receiving the clock buffer signal CKb through a gate thereof, and the SN2 transistor may be turned on by receiving the GG signal through a gate thereof. Accordingly, a logic high L state/signal, that is, a signal having the same state as that of the N1 node may be transmitted to the N4 node.

The slave latch SLA may latch the signal of the N4 node when the clock signal CK is at a logic low L state. Specifically, the SP3 and SN4 transistors may act as inverters, and may invert the QN signal of the N4 node input to the gates of the SP3 and SN4 transistors and may output the QI signal to the N5 node. When the clock signal CK is toggled from a logic high H state to a logic low L state, the CKA signal of the N6 node is supplied to the source of the SP2 transistor, and the CKB signal of the N7 node may be supplied to the source of the SN3 transistor. When the QI signal of the N5 node is input to the gates of the SP2 and SN3 transistors, the SP2 and SN3 transistors may invert the QI signal and may feed the QN signal back to the N4 node. That is, the QN signal may be latched at the N4 node.

The inverter INV1 of the output driver OUT may invert the QN signal latched at the N4 node and may output the signal as the output signal Q.

When the clock signal CK is toggled from a logic low L state to a logic high H state when the signal of the N1 node is at a logic high H state, the clock buffer signal CKb may be toggled from a logic high H state to a logic low L state. Since the toggling of the clock buffer signal CKb occurs in response to the toggling of the clock signal CK, the time at which the clock buffer signal CKb is toggled may be later than the time at which the clock signal CK is toggled. Accordingly, the TN3 transistor of the selector SELA may remain at the state of being turned on for a while after the clock signal CK is toggled.

When the signal input to the selector SELA is not maintained for a sufficient hold time, a logic high H state/signal output by the selector SELA to the N1 node may be lost through the TN3 transistor turned on before the clock buffer signal CKb is completely toggled.

Also, when the multi-bit flip-flop operates in the scan test mode, the output signal of the previous flip-flop may be directly input to the input terminal of the selector, such that, when the output signal of the previous flip-flop changes, the signal input to the selector SELA may be changed immediately. That is, since the hold time of the signal input to the selector SELA may not be sufficient, the signal of the N1 node may be lost, and the latch unit LA may latch an incorrect signal. Accordingly, it may be difficult to obtain a normal scan test result with a scan chain circuit including a multi-bit flip-flop.

Accordingly, in the scan test mode, it may be useful/required to protect the signal output by the selector of the second flip-flop FFB from being lost. In some example embodiments of the present disclosure, the slave latch of the second flip-flop FFB may have a structure different from that of the slave latch of the first flip-flop FFA.

Figure 7:
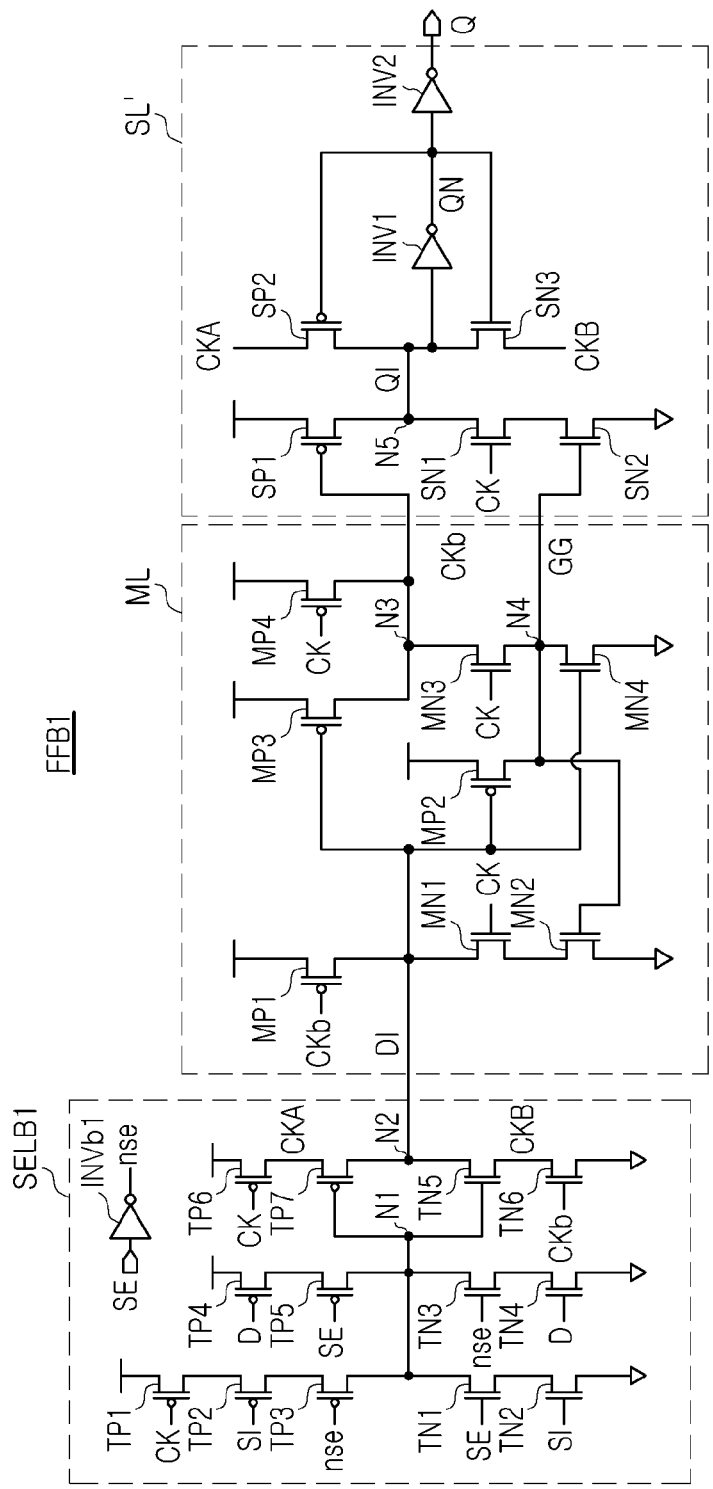
FIG. 7 is a circuit diagram illustrating a second flip-flop according to some example embodiments of the present disclosure.

FIG. 7 is a circuit diagram illustrating a second flip-flop according to some example embodiments of the present disclosure.

Referring to FIG. 7, the second flip-flop FFB1 may include a selector SELB1, a master latch ML, and a slave latch SL'. The master latch ML in FIG. 7 may have the same structure as that of the master latch ML described with reference to FIG. 6. Also, the slave latch SL' in FIG. 7 may have a structure in which an inverter INV2 is added to the N5 node of the slave latch SL described with reference to FIG. 6. Meanwhile, references/symbols commonly used in FIGS. 6 and 7 may refer to the same component(s), or may not refer to the same component(s). Hereinafter, the same description as that of the first flip-flop FFA described with reference to FIG. 6 will not be provided.

The selector SELB1 may include transistors TP1-TP7 which are P-type transistors and transistors TN1-TN6 which are N-type transistors. Also, the selector SELB1 may further include an inverter circuit INVb1 configured to receive the scan enable signal SE and to generate an inverted scan enable signal nse.

The TP1-TP3 transistors are connected in series between the power supply terminal and the N1 node, the TP4 and TP5 transistors are connected in series between the power supply terminal and the N1 node, and the TP1-TP3 transistors may be connected in parallel with the TP4-TP5 transistors. Also, the TN1 and TN2 transistors are connected in series between the N1 node and the power ground terminal, the TN3 and TN4 transistors are connected in series between the N1 node and the power ground terminal, and the TN1-TN2 transistors may be connected in parallel with the TN3-TN4 transistors. The TP6 and TP7 transistors may be connected in series between the power supply terminal and the N2 node, and the TN5 and TN6 transistors may be connected in series between the N2 node and the power ground terminal.

Gates of the TN1 and TP5 transistors may receive the scan enable signal SE, and gates of the TP3 and TN3 transistors may receive the inverted scan enable signal nse. The TP4 and TN4 transistors may receive the data signal D, and gates of the TP2 and TN2 transistors may receive the scan input signal SI. Gates of the TP1 and TP6 transistors may receive the clock signal CK, and gates of the TN6 transistors may receive the clock buffer signal CKb. Gates of the TP7 and TN5 transistors may receive the N1 node signal.

When the clock signal CK is at a logic low L state, the selector SELB may selectively output the data signal D or the scan input signal SI as a DI signal to the N2 node according to the level of the scan enable signal SE. For example, when the scan enable signal SE is at a logic high H state, the TP3 and TN1 transistors may be turned on, and the TP5 and TN4 transistors may be turned off. Since the TP1 transistor receiving the clock signal CK is turned on, the TP3 and TN2 transistors may function as an inverter to invert the scan input signal SI. The TP4 and TN4 transistors may be deactivated. Accordingly, an inverted signal of the scan input signal SI may be output to the N1 node.

When the scan enable signal SE is at a logic low L state, the TP3 and TN1 transistors may be turned off, and the TP5 and TN3 transistors may be turned on. The TP4 and TN4 transistors may function as an inverter to invert the data signal D, and the TP2 and TN2 transistors may be deactivated. Accordingly, the inverted signal of the data signal D may be output to the N1 node.

When the clock signal CK is at a logic low L state, the clock buffer signal CKb may be at a logic high H state. Accordingly, the TP6 transistor and the TN6 transistor may be turned on. Accordingly, the TP7 and TN5 transistors may function as inverters inverting the signal of the N1 node. Accordingly, the selector SELB may output the data signal D or the scan input signal SI as a DI signal to the N2 node.

When the clock signal CK is toggled from a logic low L state to a logic high H state, the TP6 transistor (which is gated to the clock signal CK) may be turned off immediately, but the TN6 transistor (which is gated with the clock buffer signal CKb generated based on the clock signal CK) may not be turned off immediately. In some example embodiment of the present disclosure, since the TR1 transistor (which is gated by the clock signal CK) is turned off immediately, an issue where current leaks to the TN6 transistor and the signal from the N2 node is lost may be reduced/prevented.

Hereinafter, a process of transferring a scan input signal using flip-flops in some example embodiments of the present disclosure will be described in greater detail with reference to FIGS. 8A to 9D.

FIGS. 8A to 8D are diagrams illustrating transfer of a test signal between flip-flops according to a comparative example different from some example embodiments of the present disclosure.

Figure 8A:
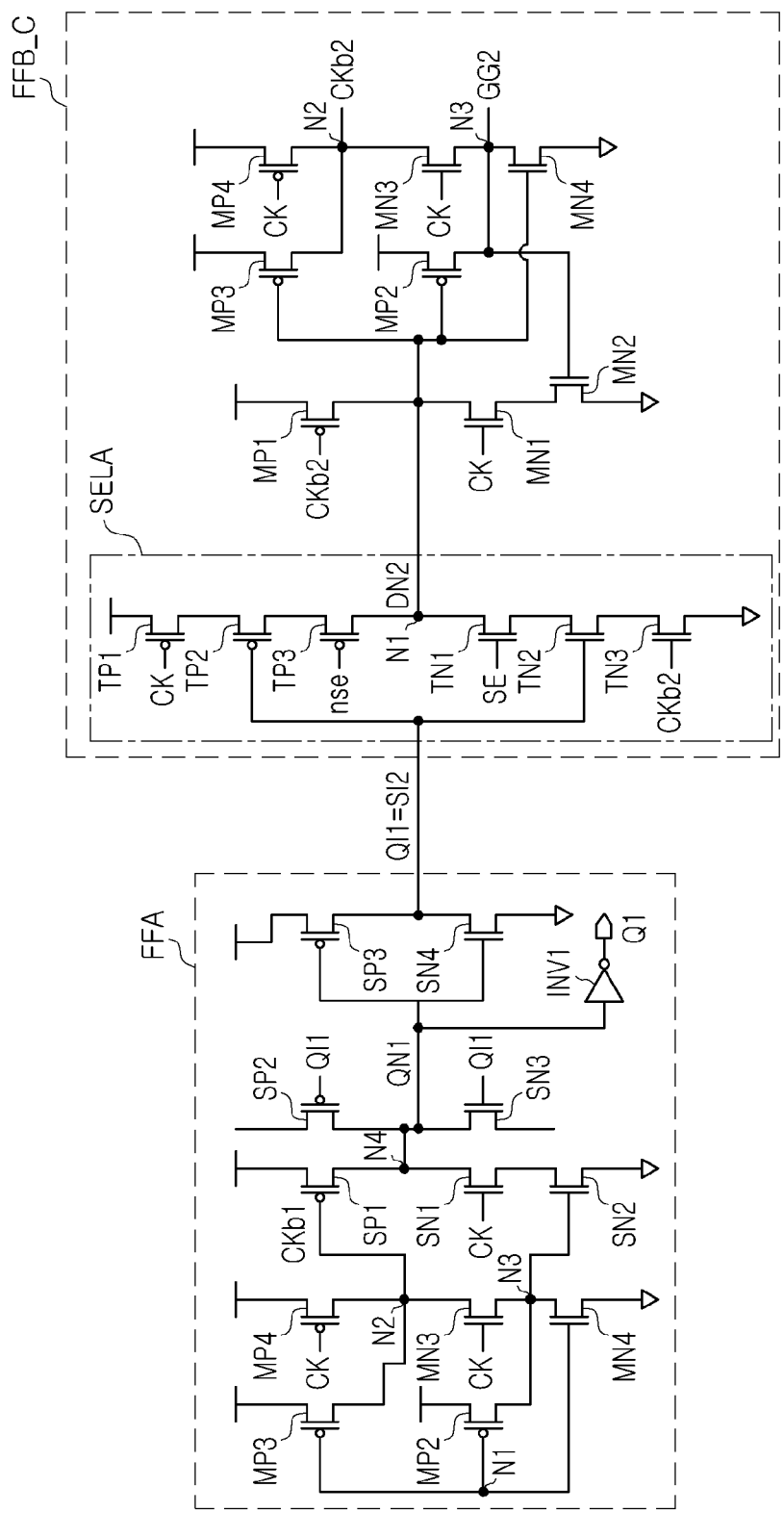
FIGS. 8A to 8D are diagrams illustrating a transfer of a test signal between flip-flops according to a comparative example different from some example embodiments of the present disclosure.

FIG. 8A illustrates the example in which the output signal QI1 of the first flip-flop FFA is input as the scan input signal SI2 to the second flip-flop FFB_C according to a comparative example. The first flip-flop FFA according to the comparative example may have the same structure as that of the first flip-flop FFA described with reference to FIG. 6, and in FIG. 8A, a portion of the master latch ML of the first flip-flop FFA and the slave latch SL are illustrated. Differently from some example embodiments, the second flip-flop FFB_C according to the comparative example may include the selector SELA described with reference to FIG. 6 instead of the selector SELB described with reference to FIG. 7. In FIG. 8A, the second flip-flop FFB_C selector SELA and a portion of the master latch ML are illustrated. In the selector SELA in FIG. 8A, the TP4, TP5, TN4 and TN5 transistors which are deactivated by the selection enable signal SE may be omitted.

Figure 8B:
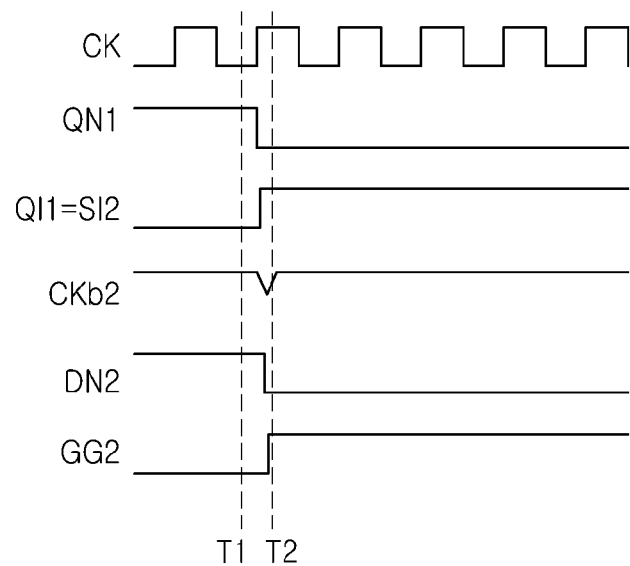
Figure 8C:
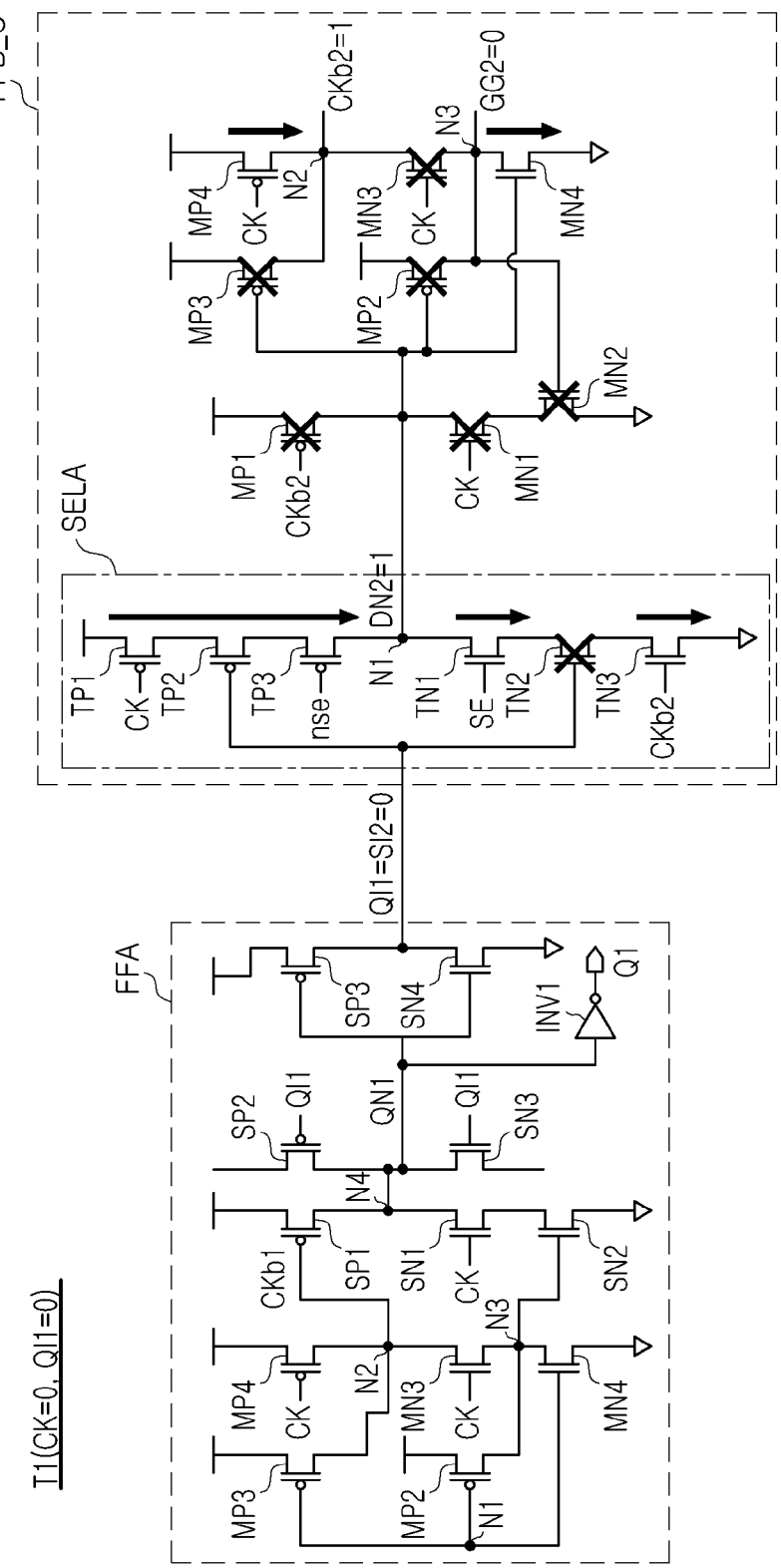
Figure 8D:
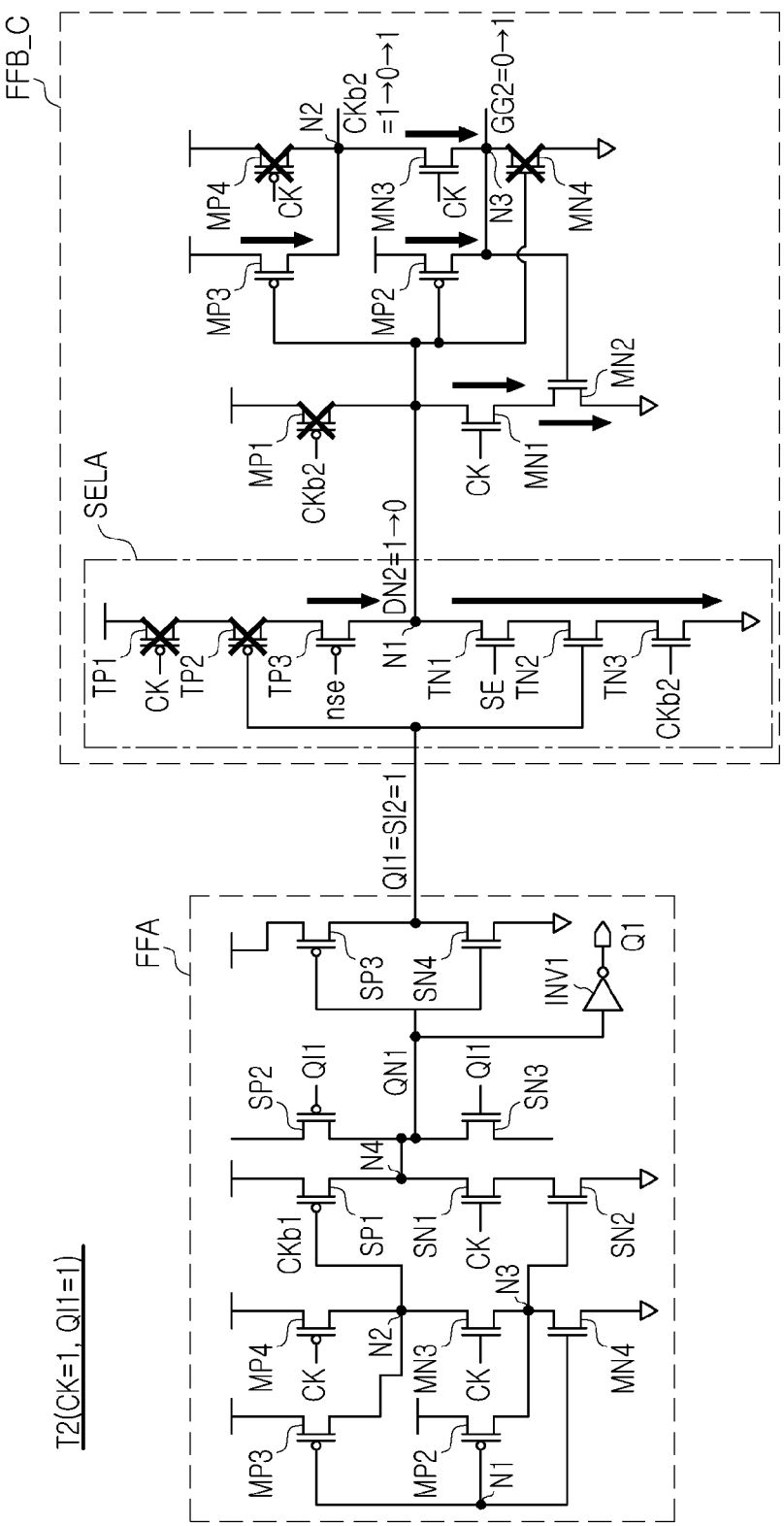

FIG. 8B is a signal diagram according to operations of flip-flops according to the comparative example illustrated in FIG. 8A. FIG. 8C is a diagram illustrating operations of the flip-flops at the time point T1 in FIG. 8B, and FIG. 8D is a diagram illustrating operation of the flip-flops at the time point T2 in FIG. 8B.

As described with reference to FIG. 6, the selector SELA included in the flip-flop may obtain a signal when the clock signal CK is at a logic low L state, the master latch ML may latch a signal when the clock signal CK is at a logic high H state, and the slave latch SL may latch a signal when the clock signal CK is at a logic low L state.

Referring to FIG. 8B, time point T1 may be a time when the clock signal CK is at a logic low L state. At time point T1, the QN1 signal of the first flip-flop FFA may be at a logic high H state, and the QI1 signal may be at a logic low L state. The QI1 signal may be input to the second flip-flop FFB_C as an SI2 signal at a logic low L state (shown as shown as QI1=SI2=0). The selector SELA may output an inverted signal of the SI2 signal as a DN2 signal. The DN2 signal may be at a logic high H state (shown as DN2=1).

Time point T2 may be when the clock signal CK is toggled to a logic high H state. The master latch ML may have to latch the DN2 signal at the time of the rising edge of the clock signal CK. However, according to the comparative example, the level of the DN2 signal may be changed from a logic high H state to a logic low L state at the time point T2, and accordingly, an error may occur in the levels of the clock buffer signal CKb2 and the GG2 signal. That is, an operation error may occur in the second flip-flop FFB_C, such as latching an incorrect signal.

Referring to FIG. 8C, the scan input signal SI2 having a logic low L state may be input to the selector SELA of the second flip-flop FFB_C at the time point T1. At the time point T1, the TP1 and MP4 transistors may be turned on and the MN1 and MN3 transistors may be turned off by the clock signal CK having a logic low L state.

In the scan test mode, the TP3 and TN1 transistors may be activated by the scan enable signal SE and the inverted scan enable signal nse, and the selector SELA may output a signal obtained by inverting the scan input signal SI2 (shown as SI2=0), that is, a logic high (H) state/signal, as a DN2 signal (shown as DN2=1).

The DN2 signal may be input to the gates of the MP2, MP3 and MN4 transistors. The MP2 and MP3 transistors may be turned off and the MN4 transistor may be turned on based on the DN2 signal which is at a logic high H state (shown as DN2=1). The N3 node may be discharged by the MN4 transistor, and the GG2 signal may have a logic low L state. The GG2 signal may be fed back to the gate of the MN2 transistor and may turn off the MN2 transistor. The N2 node may be charged by the MP4 transistor, and the CKb2 signal may have a logic high H state. The clock buffer signal CKb having a logic high H state may be fed back to the gates of the TN3 and MP1 transistors and may turn on the TN3 transistor and may turn off the MP1 transistor.

Referring to FIG. 8D, the scan input signal SI2 having a logic high H state (shown as QI1=SI2=1) may be input to the selector SELA of the second flip-flop FFB_C at a time point T2. At the time point T2, the TP1 and TP4 transistors may be turned off and the MN1 and MN3 transistors may be turned on by the clock signal CK having a logic high H state.

While the DN2 signal maintains a logic high H state, the N2 node may be discharged by the MN3 and MN4 transistors connected to each other in series, and the level of the clock buffer signal CKb2 may be gradually reduced from a logic high H state to a logic low L state. However, while the level of the clock buffer signal CKb2 is gradually reduced to a logic low L state, the TN3 transistor may maintain the turned-on state, and as the N1 node is discharged by the TN1-TN3 transistors, the DN2 signal may fail to maintain a logic high H state and may be reduced to a logic low L state.

The DN2 signal may be input to the gates of the MP2, MP3 and MN4 transistors and may turn on the MP2 and MP3 transistors, and may turn off the MN4 transistors. The N3 node may be charged by the turned-on MP2 transistor, and the GG2 signal may be at a logic high H state. The N2 node may be electrically connected to the N3 node by the MN3 transistor, and the clock buffer signal CKb may also rise to a logic high H state again. The clock buffer signal CKb2 may be fed back to the TN3 and MP1 transistors, and the GG2 signal may be fed back to the MN2 transistor such that the N1 node may latch a logic low L state/signal. That is, the second flip-flop FFB_C according to the comparative example may latch the erroneous DN2 signal at the N1 node.

FIGS. 9A to 9D are diagrams illustrating a transfer of a test signal between flip-flops according to some example embodiments of the present disclosure.

Figure 9A:
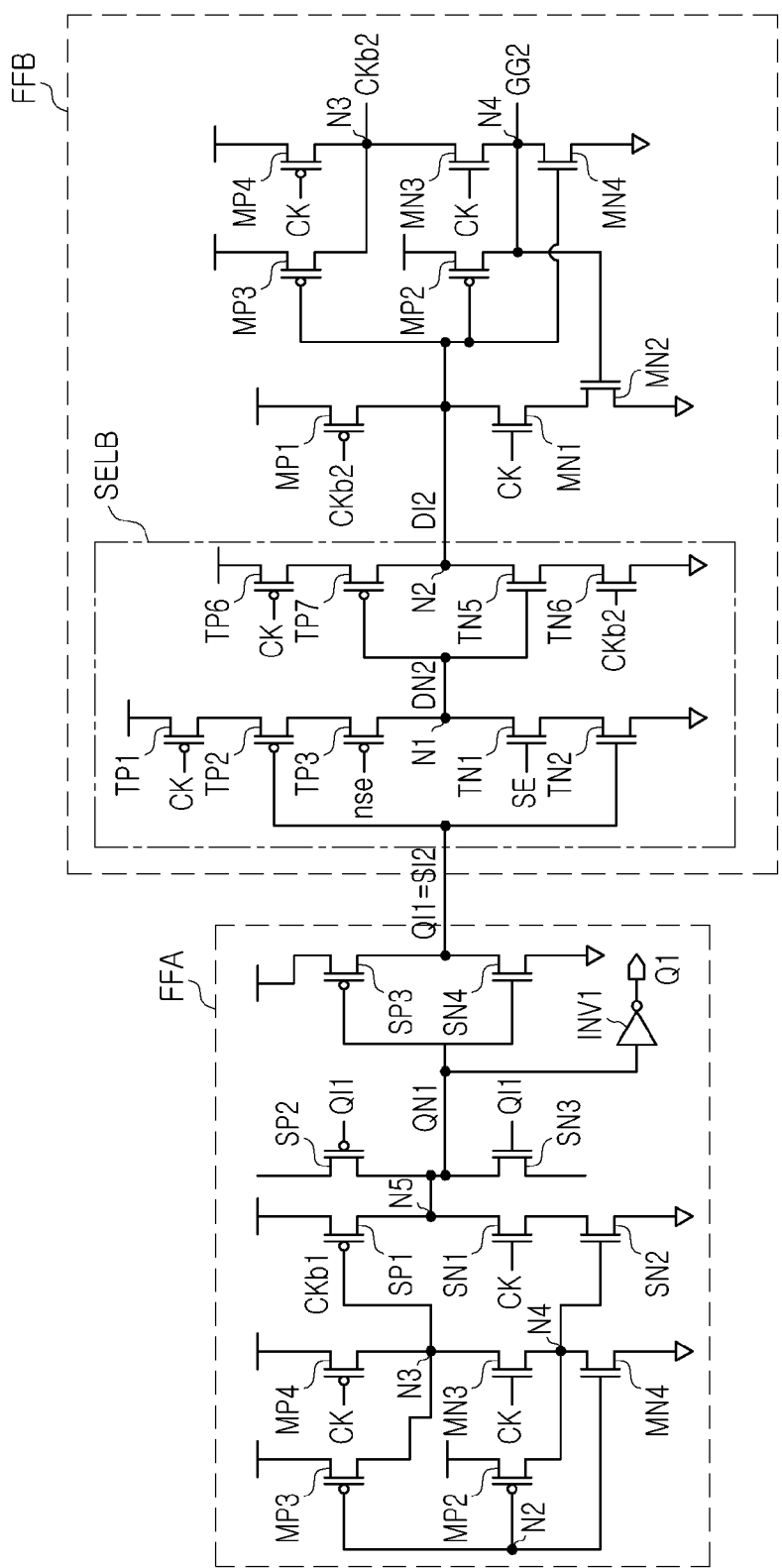
FIGS. 9A to 9D are diagrams illustrating a transfer of a test signal between flip-flops according to some example embodiments of the present disclosure.

FIG. 9A illustrates an example in which the output signal QI1 of the first flip-flop FFA is input to the second flip-flop FFB as a scan input signal SI2 in some example embodiments of the present disclosure. The first flip-flop FFA according to some example embodiments of the present disclosure may correspond to the first flip-flop FFA described with reference to FIG. 6, and the second flip-flop FFB may correspond to the second flip-flop described with reference to FIG. 7. In FIG. 9A, a portion of the master latch ML and the slave latch SL of the first flip-flop FFA are illustrated, and the selector SELB of the second flip-flop FFB and a portion of the master latch ML are illustrated. In the selector SELB in FIG. 9A, the TP4, TP5, TN3 and TN4 transistors deactivated by the selection enable signal SE may be omitted.

Figure 9B:
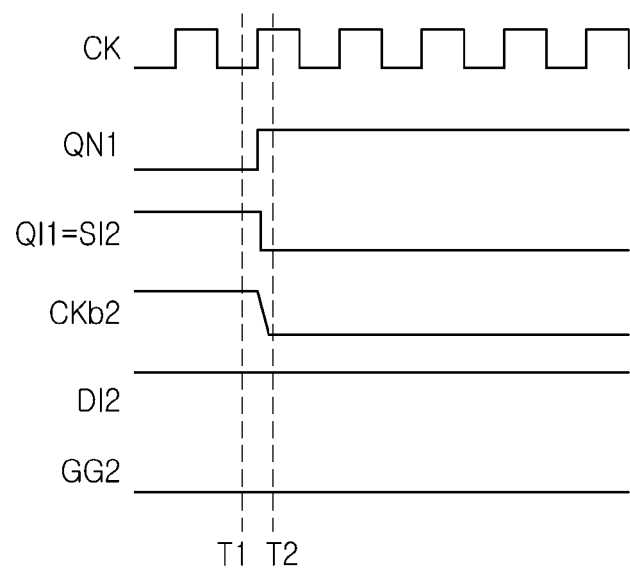
Figure 9C:
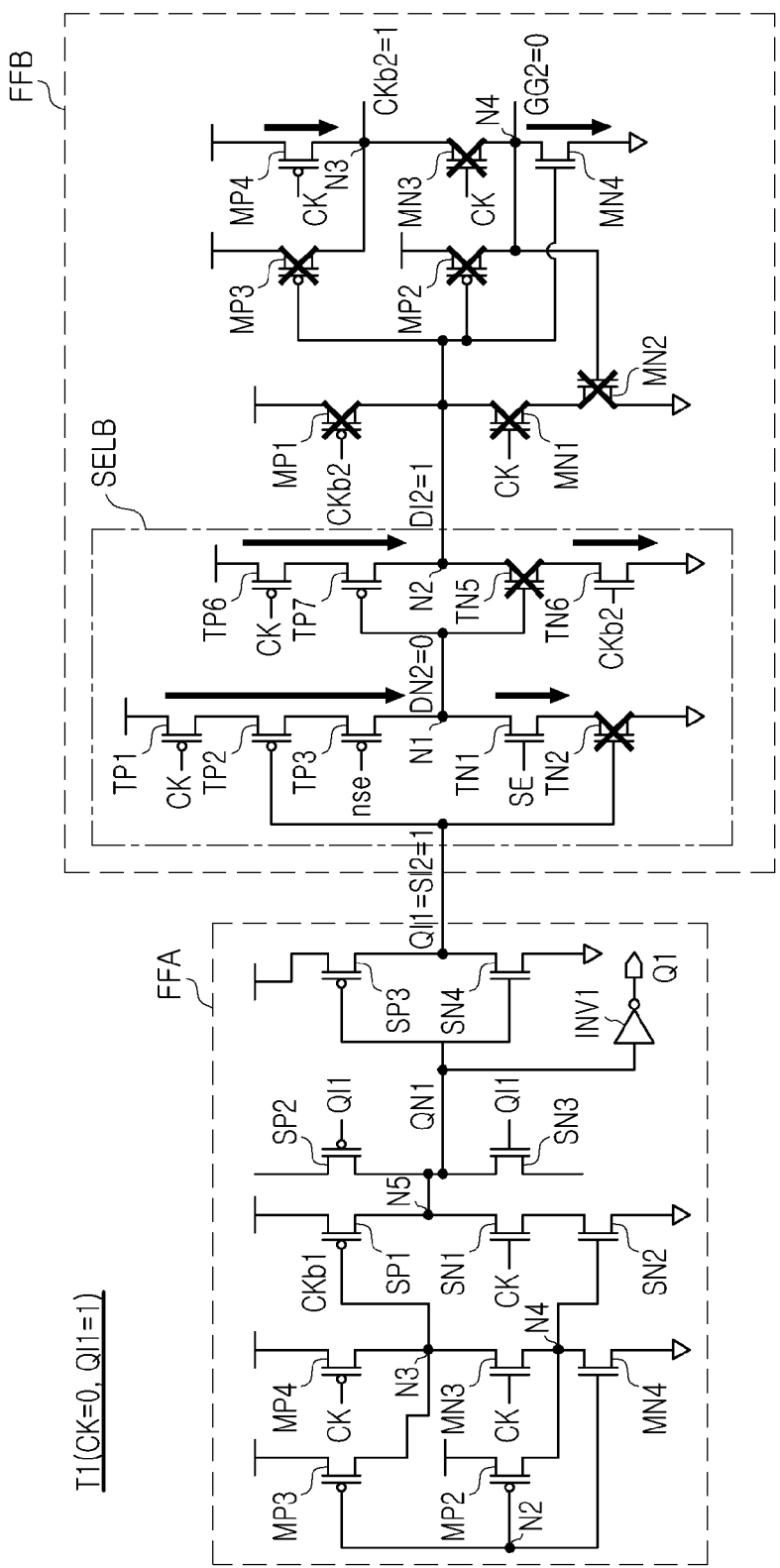
Figure 9D:
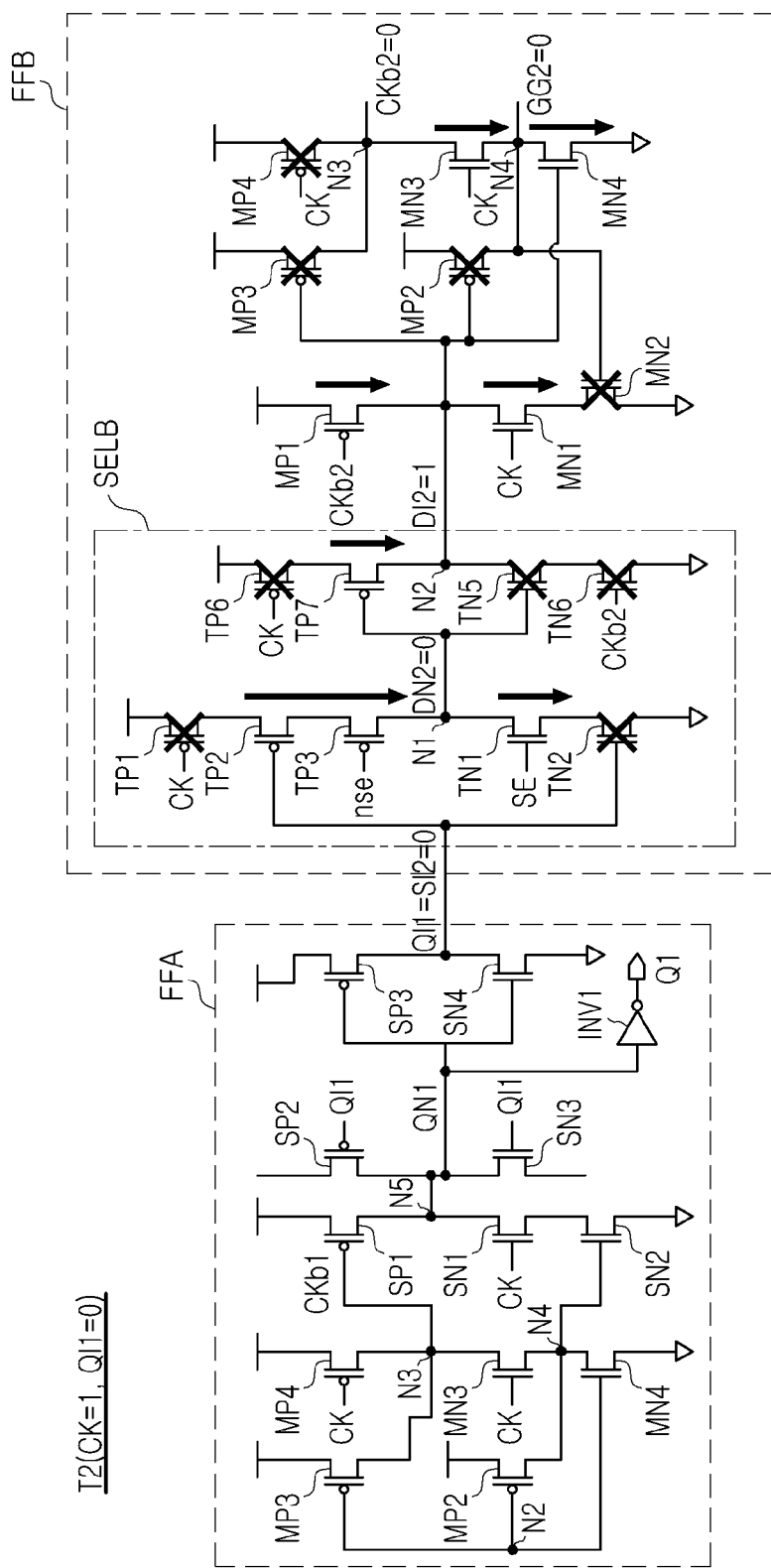

FIG. 9B is a signal diagram according to operation of flip-flops in some example embodiments of the present disclosure illustrated in FIG. 9A. FIG. 9C is a diagram illustrating operations of flip-flops at a time point T1 in FIG. 9B, and FIG. 9D is a diagram illustrating operations of flip-flops at a time point T2 in FIG. 9B.

As described with reference to FIG. 7, the selector SELB included in the flip-flop may obtain a signal when the clock signal CK is at a logic low L state, the master latch ML may latch the signal when the clock signal CK is at a logic high H state, and the slave latch SL may latch a signal when the clock signal CK is at a logic low L state.

Referring to FIG. 9B, a time point T1 may be when the clock signal CK is at a logic low L state. At time point T1, the QN1 signal of the first flip-flop FFA may be at a logic low L state, and the QI1 signal may be at a logic high H state. The QI1 signal may be input to the second flip-flop FFB as an SI2 signal at a logic high H state (shown as QI1=SI2=1). The selector SELA may invert the SI2 signal twice and may output a signal having the same logic high H state/level as that of the SI2 signal to the N2 node. That is, the DI2 signal may have a logic high H state (shown as DI2=1).

Time point T2 may be when the clock signal CK is toggled to a logic high H state. In some example embodiments of the present disclosure, the level of the DN2 signal may be maintained at the time point T2 at a logic high H state (shown as DI2=1), and accordingly, the level of the GG2 signal may be maintained at a logic low L state (shown as GG2=0), and the value of the clock buffer signal CKb2 may be changed to a normal logic low L state (shown as CKb2=0) state to have an inverted value of the clock signal CK. Accordingly, the second flip-flop FFB may latch a normal signal.

Referring to FIG. 9C, a scan input signal SI2 having a logic high H state may be input to the selector SELB of the second flip-flop FFB at a time point T1. At the time point T1, the TP1, TP6, and MP4 transistors may be turned on by the clock signal CK having a logic low L state, and the MN1 and MN3 transistors may be turned off. Since the N3 node is charged by the MP4 transistor, the CKb2 signal may be at a logic high H state (shown as CKb2=1). Accordingly, the TN6 transistor may be turned on and the MP1 transistor may be turned off.

In the scan test mode, the TP3 and TN1 transistors may be activated by the scan enable signal SE at a logic high H state and the inverted scan enable signal nse as a logic low L state, and the selector SELB may allow the N1 node to have a signal obtained by inverting the scan input signal SI2, that is, a logic low L state/signal, as the DN2 signal. Further, the DN2 signal may be input to the gates of the TP7 and TN5 transistors, and the selector SELB may output a signal obtained by inverting the DN2 signal to the N2 node, that is, a logic high H state/signal (shown as DN2=0), as the DI2 signal (shown as DI2=1).

The DI2 signal may be input to the gates of the MP2, MP3 and MN4 transistors. The MP2 and MP3 transistors may be turned off and the MN4 transistor may be turned on based on the DI2 signal that is at a logic high H state. The N4 node may be discharged by the MP2 transistor, and the GG2 signal may be at a logic low L state (shown as GG2=0). The GG2 signal may be fed back to the gate of the MN2 transistor and may turn off the MN2 transistor. The N3 node may be charged by the MP4 transistor, and the clock buffer signal CKb2 may be at a logic high H state (shown as CKb2=1). The clock buffer signal CKb2 may be fed back to the TN6 transistor and may turn on the TN6 transistor.

Referring to FIG. 9D, the scan input signal SI2 having a logic low L state (shown as QI1=SI2=0) may be input to the selector SELB of the second flip-flop FFB at a time point T2. At the time point T2, the TP1, TP6, and MP4 transistors may be turned off by the clock signal CK having a logic high H state, and the MN1 and MN3 transistors may be turned on.

Since the TP2, TP3, TN1 and TN2 transistors are deactivated when the TP1 transistor is turned off, the N1 node may electrically float from the QI1 signal. Accordingly, the N1 node may maintain the DN2 signal at a logic low L state (shown as QI1=SI2=0).

Meanwhile, the DI2 signal may be input to the gates of the MP2, MP3 and MN4 transistors and may turn off the MP3 and MP2 transistors and may turn on the MN4 transistor. Since the N4 node is discharged by the MN4 transistor, the GG2 signal may be at a logic low L state (shown as GG2=0). Since the N3 node is electrically connected to the N4 node by the MN3 transistor, the N3 node may have a logic low L state (shown as CKb2=0).

Meanwhile, since the N3 node is gradually discharged by the MN3 and MN4 transistors, the TN6 transistor receiving the clock buffer signal CKb may maintain the turned-on state until the N3 node is discharged to a predetermined level or more. However, since the DN2 signal maintains a logic low L state (shown as DN2=0), the TN5 transistor may be turned off. Accordingly, a current leak from the N2 node may be reduced, and the DI2 signal may be maintained at a logic high H state (shown as DI2=1). Accordingly, the clock buffer signal CKb2 may be normally discharged.

The clock buffer signal CKb2 may be fed back to the TN6 transistor and may turn off the TN6 transistor, and the GG2 signal may be fed back to the MN2 transistor and may turn off the MN2 transistor. Accordingly, the DI2 signal may maintain a logic high H state (shown as DI2=1), and the second flip-flop FFB may normally latch the signal at the rising edge of the clock signal CK.

In some example embodiments of the present disclosure, even when the clock buffer signal CKb2 is toggled slowly as compared to the clock signal CK, the selector SELB may quickly block a leakage current using a P-type transistor gated to a clock signal CK which may be swiftly toggled, such that loss of a signal to be latched in the master latch ML may be reduced/prevented. Accordingly, reliability of the scan test of the scan chain circuit including the second flip-flops FFBs may improve.

Meanwhile, the structure of the second flip-flop FFB in some example embodiments of the present disclosure is not limited to the structure of the second flip-flop FFB1 described with reference to FIG. 7. Hereinafter, the structure of the second flip-flop according to some example embodiments of the present disclosure will be described.

Figure 10:
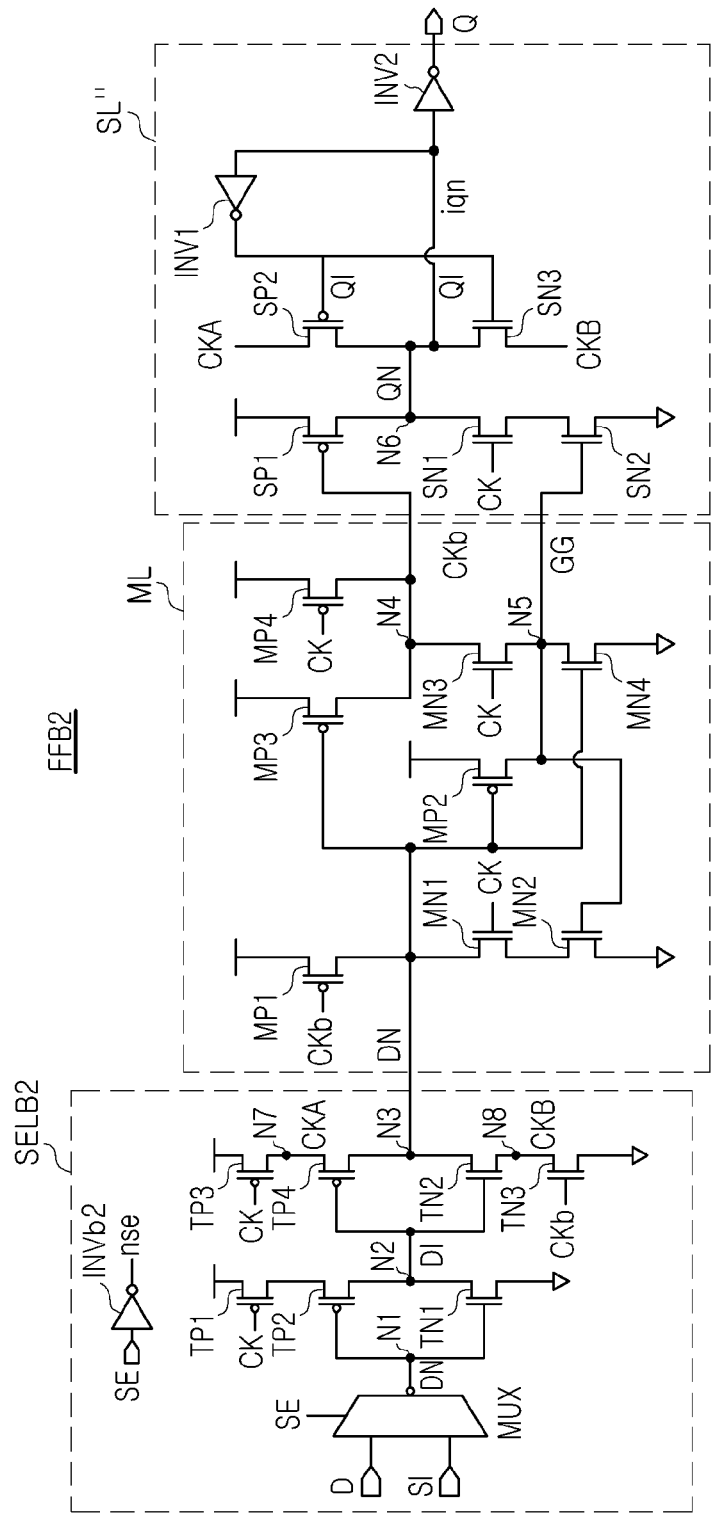
FIGS. 10 to 12 are circuit diagrams illustrating a second flip-flop according to some example embodiments of the present disclosure.
Figure 11:
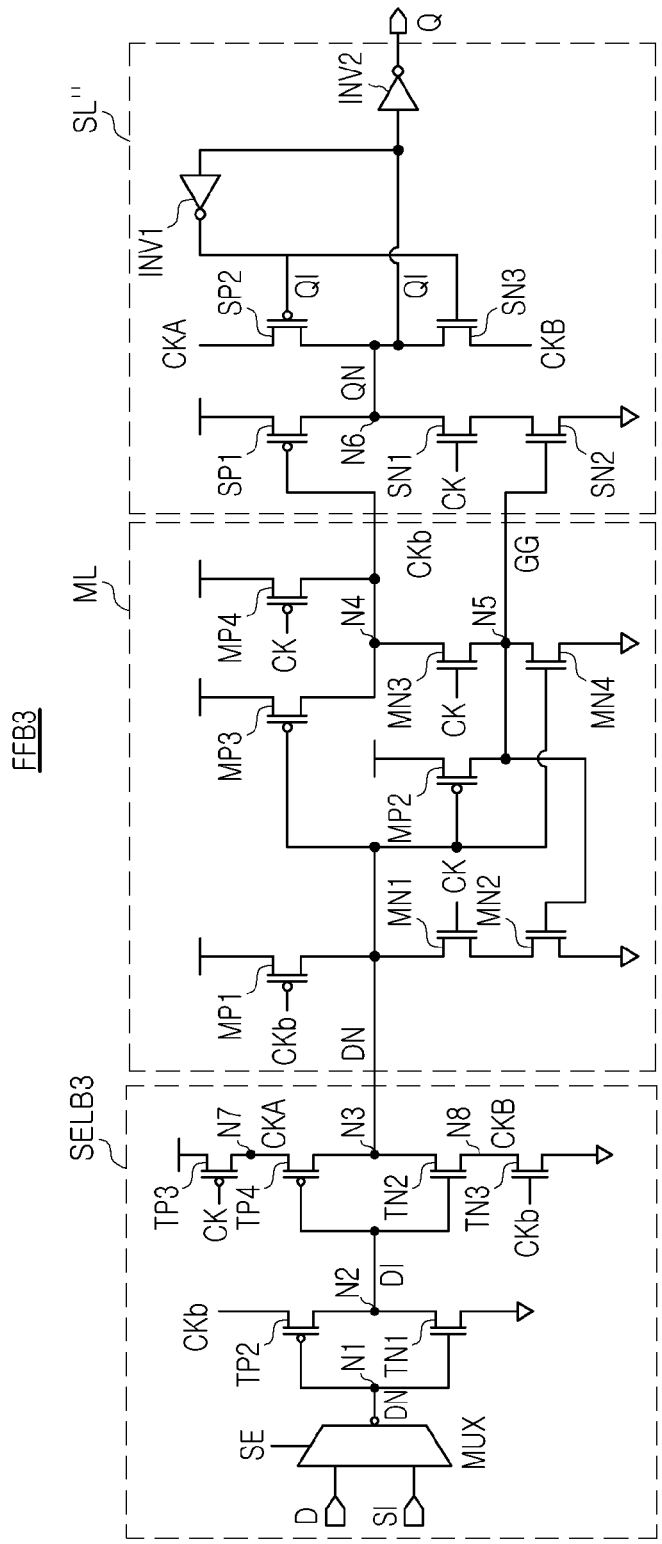
Figure 12:
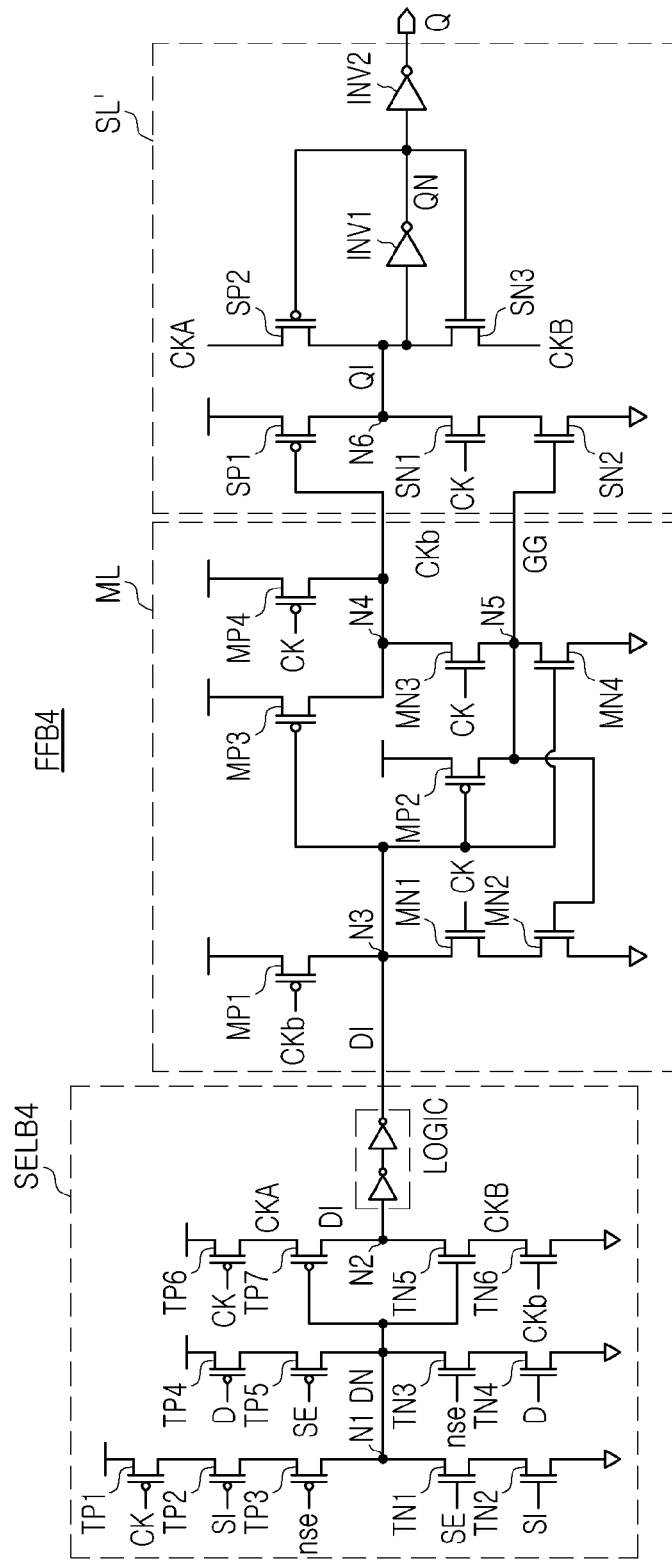

FIGS. 10 to 12 are circuit diagrams illustrating a second flip-flop according to some example embodiments of the present disclosure.

Referring to FIG. 10, the second flip-flop FFB2 may include a selector SELB2, a master latch ML, and a slave latch SL". The master latch ML in FIG. 10 may have the same structure as that of the master latch ML described with reference to FIG. 7, and the slave latch SL" in FIG. 10 have a structure similar to that of the slave latch SL' described with reference to FIG. 7. Hereinafter, the same description as that of the second flip-flop FFB1 described with reference to FIG. 7 may be omitted for the sake of conciseness.

The selector SELB2 may include a multiplexer MUX, TP1-TP3 transistors which are P-type transistor, and TN1-

TN3 transistors which are an N-type transistor. Also, the selector SELB may further include an inverter circuit INVb2 configured to receive the scan enable signal SE and to generate an inverted scan enable signal nse.

The multiplexer MUX may selectively output the data signal D or the scan input signal SI to the N1 node based on the scan enable signal SE. In some example embodiments of the present disclosure, the multiplexer MUX may output a DN signal obtained by inverting the data signal D or the scan input signal SI to the N1 node as illustrated in FIG. 10.

The TP1 and TP2 transistors may be connected in series between the power supply terminal and the N2 node, and the TN1 transistor may be connected to the power ground terminal and the N2 node. The gate of the TP1 transistor may receive the clock signal CK, and the gates of the TP2 and TN1 transistors may receive the signal of the N1 node. The TP2 and TN1 transistors may output the DI signal in which the DN signal may be inverted to the N2 node when the clock signal CK is at a logic low L state.

The TP3 and TP4 transistors may be connected in series between the power supply terminal and the N3 node, and the TN2 and TN3 transistors may be connected in series between the N3 node and the power ground terminal. The gate of the TP3 transistor may receive the clock signal CK, the gates of the TP4 and TN2 transistors may receive the signal of the N2 node, and the gate of the TN3 transistor may receive the clock buffer signal CKb. The TP4 and TN2 transistors may output a DN signal in which the DI signal of the N2 node is inverted to the N3 node when the clock signal CK is at a logic low L state.

The master latch ML may latch the signal of the N3 node by operating in the same manner as described with reference to FIG. 7, and may output a signal having the same level as that of the signal of the N3 node to the N6 node. In the example in FIG. 10, the master latch ML may latch a DN signal to the N3 node and may output a QN signal having the same level as that of the DN signal to the N6 node.

The slave latch SL" may operate in response to the CKA signal from the N7 node and the CKB signal from the N8 node of the selector SLEB2. The slave latch SL" may latch the QN signal of the N6 node when the clock signal CK is at logic low L state, and the slave latch SL" may output the inverted signal of the QN signal as the output signal Q using the inverter INV2.

After the clock signal CK is toggled from a logic low L state to a logic high H state, the clock buffer signal CKb may be slowly toggled, and the TN3 transistor receiving the clock buffer signal CKb may still be turned on, and leakage current may occur.

In some example embodiments of the present disclosure, the selector SELB2 may hold the signal of the N2 node by turning off the TP1 transistor in response to a logic high H state of the clock signal CK. The signal from the N2 node may turn off the TN2 transistor, thereby reducing/preventing loss of the signal from the N3 node and allowing the master latch ML to latch the correct signal.

Referring to FIG. 11, the second flip-flop FFB3 may include a selector SELB3, a master latch ML, and a slave latch SL". The master latch ML and the slave latch SL" in FIG. 11 may have the same structure as those of the master latch ML and the slave latch SL" described with reference to FIG. 10.

As comparing the selector SELB2 in FIG. 10 with the selector SELB3 in FIG. 11, the TP1 transistor included in the selector SELB2 may be omitted from the selector SELB3. In some example embodiments of the present disclosure, the selector SELB3 may share the MP4 transistor of the master latch ML by being connected to the N4 node. FIG. 11 illustrates that the source of the TP2 transistor may receive the clock buffer signal CKb, which is the signal of the N4 node.

According to some example embodiments of the present disclosure described with reference to FIG. 11, since the transistor used to hold the N2 signal may be shared with the master latch ML, the power consumption of the second flip-flop FFB may be reduced, and power consumption of the multi-bit flip-flop including the plurality of second flip-flops FFB, and further, the scan chain circuit may be reduced.

Referring to FIG. 12, the second flip-flop FFB4 may include a selector SEL4, a master latch ML, and a slave latch SL'. The master latch ML and the slave latch SL' in FIG. 12 may have the same structure as those of the master latch ML and the slave latch SL' described with reference to FIG. 7. Comparing the selector SELB4 in FIG. 12 with the selector SELB1 in FIG. 7, the selector SELB4 in FIG. 12 may further include a buffer logic LOGIC connected between the output terminal of the selector SELB1 of FIG. 7 and the input terminal of the master latch ML.

The buffer logic LOGIC may increase the hold time of the signal of the N3 node latched by the master latch ML. For example, FIG. 12 illustrates the example in which the buffer logic LOGIC may include two stages of inverters. Since the inverter having two stages may delay a signal having the same level as that of the signal of the N2 node and may output the signal to the N3 node, the hold time may increase.

Some example embodiments of the present disclosure are not limited to the buffer logic LOGIC including two inverter stages, and the buffer logic LOGIC may include an inverter of an even number of inverter stages, and/or may include various other delay circuits. Also, the buffer logic LOGIC may connect the output terminals of the selectors SELB2 and SELB3 described with reference to FIGS. 10 and 11 to the input terminals of the master latch ML.

Figure 13:
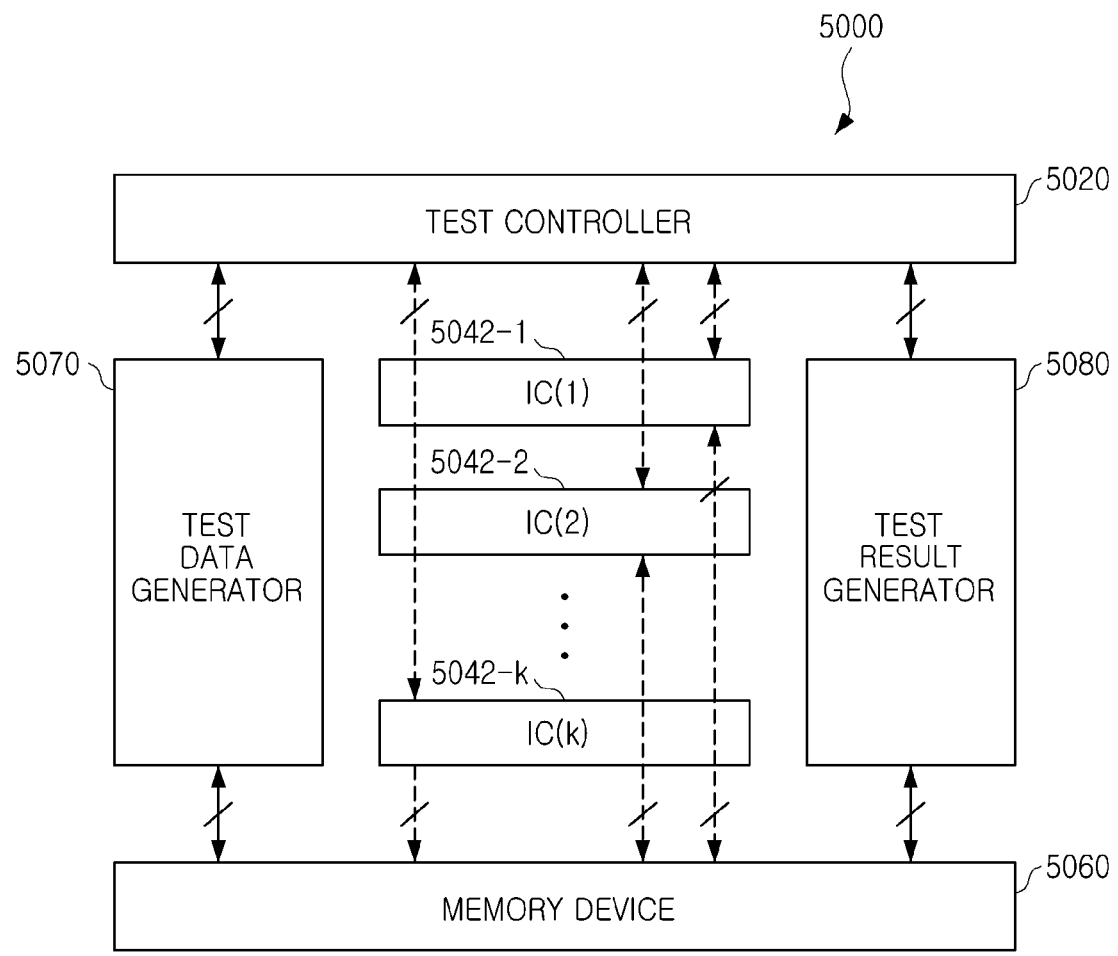
FIG. 13 is a block diagram illustrating an integrated circuit test system according to some example embodiments of the present disclosure.

FIG. 13 is a block diagram illustrating an integrated circuit test system according to some example embodiments of the present disclosure.

Referring to FIG. 13, the integrated circuit test system 5000 may include a test controller 5020, first to k-th (where k is an integer greater than or equal to 1) integrated circuits 5040-1, . . . , 1040-k), a memory device 5060, a test data generator 5070, and a test result generator 5080. In this case, each of the first to k-th integrated circuits 5040-1, . . . , 5040-k may include a combinational logic circuit and a scan chain circuit, and the scan chain circuit may include flip-flops, and the flip-flops may be connected to a combinatorial logic circuit and may form a scan path. In some example embodiments of the present disclosure, each of the first to k-th integrated circuits 5040-1, . . . , 5040-k may be implemented as a system-on-chip.

The test controller 5020 may control a scan test for each of the first to k-th integrated circuits 5040-1, . . . , 5040-k by controlling first to k-th integrated circuits 5040-1, . . . , 5040-k, a memory device 5060, a test data generator 5070, and a test result generator 5080. In this case, the integrated circuit test system 5000 may perform the scan test by performing a shift-in operation of loading a test pattern into a scan chain circuit in sequence for each of the first to kth integrated circuits 5040-1, . . . , 5040-k, performing a capture operation of storing the result value of the combinational logic circuit based on the loaded test pattern in the scan chain circuit, and performing a shift-out operation of outputting the result values stored in the scan chain circuit in sequence.

The scan chain circuit included in each of the first to k-th integrated circuits 5040-1, . . . 5040-k may include multi-bit flip-flops sharing a clock signal, and each of the multi-bit flip-flops may include flip-flops sharing a clock signal. The flip-flops included in the multi-bit flip-flop may be connected to each other in series and may be included in a scan chain circuit.

In some example embodiments of the present disclosure, a first flip-flop FFA receiving a scan input signal from an external entity when performing a scan test, and second flip-flops FFB receiving a scan input signal from an output terminal of another flip-flop may have different structures. The second flip-flops FFB may be selection circuits used to selectively output a scan input signal or a data signal to a master latch, and may include a first inverter having an output terminal connected to an output terminal of the selection circuit and operating based on a clock signal CK and a clock buffer signal CKb, and a second inverter having an output terminal connected to the input terminal of the first inverter and operating based on the clock signal CK. The selection circuit of the second flip-flop FFB in some example embodiment of the present disclosure may swiftly cut off a leakage current through the first inverter in response to the clock signal CK even when the second flip-flop FFB operates using the clock buffer signal CKb internally generated in response to the clock signal CK, which has been described above, and accordingly, overlapping descriptions will not be provided.

The memory device 5060 may store data that is useful/required for the integrated circuit test system 5000 to perform a scan test. Specifically, the memory device 5060 may store: a test pattern generated by the test data generator 5070 and applied to the scan chain circuit included in the first to k-th integrated circuits 5040-1, . . . , 5040-k, respectively; a result value of the combinational logic circuit based on the test pattern output through the scan chain circuit' a reference pattern compared to the resulting value; and a test result output by the test result generator 5080 by comparing the result value with the reference pattern. For example, the memory device 5060 may include a nonvolatile memory device such as an erasable programmable read-only memory (EPROM) device, an electrically erasable programmable read-only memory (EEPROM) device, a flash memory device, a erasable programmable read-only memory (PRAM) device, a resistance random access memory (RRAM) Device, a nano floating gate memory (NFGM) device, a polymer random access memory (PoRAM) device, a magnetic random access memory (MRAM) device, a ferroelectric random access memory (FRAM) device, and/or a volatile memory device such as dynamic random access memory (DRAM) device, static random access memory (SRAM) device, and/or a mobile device. In some example embodiments of the present disclosure, the integrated circuit test system 5000 may further include a storage device such as a solid state drive (SSD), a hard disk drive (HDD), and/or a CD-ROM.

The test data generator 5070 may generate test results by comparing the resulting value with a reference pattern output by performing a shift-in operation in which a test pattern is loaded into a scan chain circuit in sequence in each of the first to kth integrated circuits 5040-1, . . . , 5040-k, a capture operation in which the result value of the combinatorial logic circuit based on the loaded test pattern is stored in the scan chain circuit, and a shift-out operation in which the result value stored in the scan chain circuit is output in sequence. For example, when the result value matches the reference pattern, the test result generator 5080 may output a test result indicating that there is no defect in the combinational logic circuit, and when the result value does not match the reference pattern, the test result generator 5080 may output a test result indicating that the combinational logic circuit is defective. Meanwhile, the integrated circuit test system 5000 may repeat the scan test for each of the first to k-th integrated circuits 5040-1, . . . 5040-k multiple times to derive more accurate test results.

According to the aforementioned example embodiments of the present disclosure, the scan chain circuit may improve reliability of the scan test by reducing/preventing loss of a scan input signal received from a previous flip-flop in a scan chain circuit including a plurality of flip-flops.

The flip-flop further may reduce/prevent signal loss due to slow toggling of the clock buffer signal by further including an inverter circuit to output a signal in response to the clock signal to the input terminal of the inverter circuit outputting a signal in response to the clock signal and the clock buffer signal in the selection circuit used to select whether to perform the scan test.

While some example embodiments of the present disclosure have been illustrated and described above, it will be apparent to those skilled in the art that modifications and variations could be made without departing from the scope of the present disclosure as defined by the appended claims.

What is claimed is:
1. A flip-flop circuit, comprising:
   a selection circuit having a first node and a second node, wherein the selection circuit includes,
   first, second, and third P-type transistors connected in series between a power supply terminal and the first node,
   fourth and fifth P-type transistors connected in series between the power supply terminal and the first node,
   first and second N-type transistors connected in series between the first node and a power ground terminal,
   third and fourth N-type transistors connected in series between the first node and the power ground terminal, and
   a first inverter having a first inverter input terminal connected to the first node and a first inverter output terminal connected to the second node, wherein the first inverter is configured to output one of a data signal or a scan input signal to the first inverter output terminal in response to a clock signal, a signal of a third node, or a combination of the clock signal and the signal of the third node,
   wherein a scan enable signal is input to gates of the first N-type transistor and the fifth P-type transistor,
   wherein the data signal is input to gates of the fourth P-type transistor and the fourth N-type transistor,
   wherein an inverted scan enable signal is input to gates of the third P-type transistor and the third N-type transistor, and
   wherein the scan input signal is input to gates of the second P-type transistor and the second N-type transistor;
   a master latch circuit connected between the second node and the third node; and
   a slave latch circuit connected between the third node and a flip-flop circuit output terminal.
2. The flip-flop circuit of claim 1, wherein the first inverter includes,
   sixth and seventh P-type transistors connected in series between the power supply terminal and the second node, and fifth and sixth N-type transistors connected in series between the second node and the power ground terminal,
wherein the clock signal is applied to a gate of the sixth P-type transistor,
wherein the first node is connected to gates of the seventh P-type transistor and the fifth N-type transistor, and
wherein the third node is connected to a gate of the sixth N-type transistor.

3. The flip-flop circuit of claim 2, wherein the master latch circuit includes
an eighth P-type transistor connected between the power supply terminal and the second node,
seventh and eighth N-type transistors connected in series between the second node and the power ground terminal,
ninth and tenth P-type transistors connected in parallel between the power supply terminal and the third node,
ninth and tenth N-type transistors connected in series between the third node and the power ground terminal, transistor, and
an eleventh P-type transistor connected between the power supply terminal and the fourth node,
wherein a gate of the eighth P-type transistor is connected to the third node,
wherein gates of the seventh N-type transistor, the tenth P-type transistor, and the ninth N-type transistor are connected to the clock signal,
wherein a gate of the eighth N-type transistor is connected to the fourth node, and
wherein the ninth P-type transistor, the eleventh P-type transistor, and the tenth N-type transistor are connected to the second node.

4. The flip-flop circuit of claim 2,
wherein a fifth node of the selection circuit connects a drain of the sixth P-type transistor to a source of the seventh P-type transistor and a sixth node of the selection circuit connects a source of the fifth N-type transistor to a drain of the sixth N-type transistor,
wherein the slave latch circuit further includes,
a twelfth P-type transistor, an eleventh N-type transistor, and a twelfth N-type transistor connected in series between the power supply terminal and the power ground terminal, wherein a seventh node connects a drain of the twelfth P-type transistor to a drain of the eleventh N-type transistor,
a thirteenth P-type transistor connected between the fifth node and the seventh node,
a thirteenth N-type transistor connected between the seventh node and the sixth node, a second inverter having an input terminal connected to the seventh node, wherein an eighth node is connected to an output terminal of the second inverter, and
a third inverter having an input terminal connected to the eighth node and an output terminal connected to the flip-flop circuit output terminal,
wherein a gate of the twelfth P-type transistor is connected to the third node,
wherein a gate of the eleventh N-type transistor is connected to the clock signal,
wherein a gate of the twelfth N-type transistor is connected to a fourth node, and
wherein gates of the thirteenth P-type transistor and the thirteenth N-type transistor are connected to the output terminal of the second inverter.

5. The flip-flop circuit of claim 1, wherein the flip-flop circuit further includes:
an inverter chain circuit including an even number of inverters, and having an input terminal connected to the first inverter output terminal, wherein the inverter chain circuit is connected between the first inverter output terminal and the second node.

6. The flip-flop circuit of claim 1,
wherein the master latch circuit latches a signal of the second node responsive to a logic high state of the clock signal, and
wherein the slave latch circuit latches the signal of the second node at the flip-flop circuit output terminal.

7. A flip-flop circuit, comprising:
a selection circuit including a multiplexer, a first inverter, and a second inverter, wherein the first inverter is connected between the multiplexer and the second inverter,
wherein the multiplexer is configured to output one of a data signal or a scan input signal to a first node in response to a scan enable signal,
wherein the first inverter is connected between the first node and a second node, wherein the first inverter is configured to invert a signal of the first node to provide a first inverted signal to the second node in response to a clock signal, and
wherein the second inverter is connected between the second node and a third node,
wherein the second inverter is configured to invert the first inverted signal of the second node to provide a second inverted signal to the third node in response to the clock signal and a signal of a fourth node;
a master latch circuit connected between the third node and the fourth node; and
a slave latch circuit connected between the fourth node and a flip-flop circuit output terminal of the flip-flop circuit, so that the master latch circuit is connected between the selection circuit and the slave latch circuit.

8. The flip-flop circuit of claim 7, wherein the first inverter includes,
first and second P-type transistors connected in series between a power supply terminal and the second node, and
a first N-type transistor connected between the second node and a power ground terminal,
wherein a gate of the first P-type transistor is connected to the clock signal; and
wherein gates of the second P-type transistor and the first N-type transistor are connected to the first node.

9. The flip-flop circuit of claim 8, wherein the second inverter includes,
third and fourth P-type transistors connected in series between the power supply terminal and the third node, and
second and third N-type transistors connected in series between the third node and the power ground terminal,
wherein a gate of the third P-type transistor is connected to the clock signal,
wherein gates of the fourth P-type transistor and the second N-type transistor are connected to the second node, and
wherein a gate of the third N-type transistor is connected to the fourth node.

10. The flip-flop circuit of claim 7,
wherein the master latch circuit includes:
a fifth P-type transistor connected between a power supply terminal and the third node;

fourth and fifth N-type transistors connected in series between the third node and the power ground terminal;

sixth and seventh P-type transistors connected in parallel between the power supply terminal and the fourth node;

sixth and seventh N-type transistors connected in series between the fourth node and the power ground terminal, wherein a fifth node connects a source of the sixth N-type transistor and a drain of the seventh N-type transistor; and an eighth P-type transistor connected between the power supply terminal and the fifth node, wherein a gate of the fifth P-type transistor is connected to the fourth node, wherein gates of the fourth N-type transistor, the seventh P-type transistor, and the sixth N-type transistor are connected to the clock signal, wherein a gate of the fifth N-type transistor is connected to the fifth node, and wherein gates of the sixth P-type transistor, the eighth P-type transistor, and the seventh N-type transistor are connected to the third node.

11. The flip-flop circuit of claim 10, wherein the first inverter includes, a second P-type transistor connected between the fourth node and the second node; and a first N-type transistor connected between the second node and the power ground terminal, and wherein gates of the second P-type transistor and the first N-type transistor are connected to the first node.

12. The flip-flop circuit of claim 10, wherein the slave latch circuit includes, a ninth P-type transistor, an eighth N-type transistor, and a ninth N-type transistor connected in series between the power supply terminal and the power ground terminal, wherein a sixth node connects a drain of the ninth P-type transistor to a drain of the eighth N-type transistor, wherein a gate of the ninth P-type transistor is connected to the fourth node, wherein a gate of the eighth N-type transistor is connected to the clock signal, and wherein a gate of the ninth N-type transistor is connected to the fifth node, a tenth P-type transistor connected between the power supply terminal and the sixth node, a tenth N-type transistor connected between the sixth node and the power ground terminal, a third inverter having an input terminal connected to the sixth node and an output terminal connected to gates of the tenth P-type transistor and the tenth N-type transistor, and a fourth inverter having an input terminal connected to the sixth node and an output terminal connected to the flip-flop circuit output terminal.

13. The flip-flop circuit of claim 7, further comprising:

a delay circuit connected between an output terminal of the second inverter and the third node.

14. A scan chain circuit, comprising:

a first flip-flop including a first selection circuit, a first master latch circuit, and a first slave latch circuit, wherein the first selection circuit includes a first selection circuit input terminal configured to receive a first scan input signal, and wherein the first slave latch circuit includes a first slave latch circuit output terminal; and a second flip-flop including a second selection circuit, a second master latch circuit, and a second slave latch circuit, wherein the second selection circuit includes a second selection circuit input terminal connected to the first slave latch circuit output terminal, wherein the second master latch circuit includes a second master latch circuit input terminal, wherein the first and second flip-flops share a clock signal, wherein the second flip-flop inverts the clock signal to generate a second clock buffer signal, wherein the second selection circuit includes first, second, and third inverters, wherein the first inverter is configured to invert a second scan input signal received at the second selection circuit input terminal from the first slave latch circuit output terminal to generate an inverted scan input signal that is output to a first node when the clock signal is at a logic low state and a scan enable signal is at a logic high state, wherein the second inverter is configured to invert a data signal received from outside the scan chain circuit to generate an inverted data signal that is output to the first node when the scan enable signal is at a logic low state, and wherein the third inverter is configured to invert a signal of the first node based on the clock signal the second clock buffer signal, or a combination of the clock signal and the second clock buffer signal, to generate an inverted first node signal and to output the inverted first node signal to the second master latch circuit input terminal.

15. The scan chain circuit of claim 14, wherein the first flip-flop inverts the clock signal to generate a first clock buffer signal, and wherein the first selection circuit includes a multiplexer configured to generate a data signal responsive to input from outside the scan chain circuit or to invert the first scan input signal based on the clock signal, the first clock buffer signal, and the scan enable signal.

16. The scan chain circuit of claim 14, wherein the second selection circuit includes a second node connecting an output terminal of the third inverter to the second master latch circuit input terminal, wherein the first inverter includes a first P-type transistor connected between a power supply terminal and the first node and receiving the clock signal through a gate of the first P-type transistor, and wherein the third inverter includes a second P-type transistor connected between the power supply terminal and the second node and receiving the clock signal through a gate of the second P-type transistor, and a first N-type transistor connected between the second node and a power ground terminal and receiving the second clock buffer signal through a gate of the first N-type transistor.

17. The scan chain circuit of claim 14, wherein the second master latch circuit is configured to latch a signal of the second master latch circuit input terminal as a second master latch circuit output signal in response to a logic high state of the clock signal, and wherein the second slave latch circuit is configured to latch the second master latch circuit output signal as a second slave latch circuit output signal at a second flip-flop output terminal of the second flip-flop in response to a logic low state of the clock signal.

18. The scan chain circuit of claim 14, wherein the second flip-flop further includes a delay circuit connected between the second selection circuit and the second master latch circuit.

19. The scan chain circuit of claim 18, wherein the delay circuit includes an inverter chain circuit having an even number of inverters connected between the second selection circuit and the second master latch circuit.

20. The scan chain circuit of claim 14, wherein an output terminal of the first inverter floats in response to the clock signal toggled to a logic high state.

* * * * *